United States Patent
Tautz et al.

(10) Patent No.: US 12,094,928 B2
(45) Date of Patent: Sep. 17, 2024

(54) METHOD FOR STRUCTURING A SEMICONDUCTOR SURFACE AND SEMICONDUCTOR BODY COMPRISING A SEMICONDUCTOR SURFACE HAVING AT LEAST ONE STRUCTURE

(71) Applicant: OSRAM Opto Semiconductors GmbH, Regensburg (DE)

(72) Inventors: Markus Tautz, Regensburg (DE); Matthew John Davies, Regensburg (DE); Martin Welzel, Dresden (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 432 days.

(21) Appl. No.: 17/439,695

(22) PCT Filed: Mar. 13, 2020

(86) PCT No.: PCT/EP2020/056911
§ 371 (c)(1),
(2) Date: Sep. 15, 2021

(87) PCT Pub. No.: WO2020/187763
PCT Pub. Date: Sep. 24, 2020

(65) Prior Publication Data
US 2022/0165845 A1    May 26, 2022

(30) Foreign Application Priority Data

Mar. 19, 2019    (DE) .......................... 102019106964.5

(51) Int. Cl.
*H01L 29/06*    (2006.01)
*H01L 21/306*    (2006.01)
(Continued)

(52) U.S. Cl.
CPC .... *H01L 29/0657* (2013.01); *H01L 21/30608* (2013.01); *H01L 29/2003* (2013.01); *H01L 29/66462* (2013.01); *H01L 29/66469* (2013.01)

(58) Field of Classification Search
CPC ...................... H01L 29/66462; H01L 29/0657
See application file for complete search history.

(56) References Cited

U.S. PATENT DOCUMENTS

| | | | |
|---|---|---|---|
| 2009/0087994 | A1 | 4/2009 | Lee et al. |
| 2012/0119237 | A1 | 5/2012 | Leatherdale et al. |
| 2014/0242801 | A1 | 8/2014 | Desplats et al. |

FOREIGN PATENT DOCUMENTS

| | | |
|---|---|---|
| DE | 102010012044 A1 | 9/2011 |
| EP | 1089329 A1 | 4/2001 |

(Continued)

OTHER PUBLICATIONS

Tautz, M. "Wet-Chemical Etching of GaN: Underlying Mechanism of a Key Step in Blue and white LED Production" Chemistry Select 3(5) Feb. 2018 pp. 1480-1494 (Year: 2018).*

(Continued)

*Primary Examiner* — Grant S Withers
(74) *Attorney, Agent, or Firm* — Slater Matsil, LLP

(57) ABSTRACT

In an embodiment a method for structuring a semiconductor surface includes providing the semiconductor surface, wherein the semiconductor surface is part of a GaN-semiconductor layer, irradiating the semiconductor surface with an electron beam in order to produce an irradiated section and anisotropic wet-chemical etching of the semiconductor surface, wherein an etching rate in the irradiated section is less than that in an unirradiated section of the semiconductor (Continued)

surface, and wherein no etching mask is applied to the semiconductor surface before anisotropic wet-chemical etching.

19 Claims, 20 Drawing Sheets

(51) Int. Cl.
    *H01L 29/20*      (2006.01)
    *H01L 29/66*      (2006.01)

(56) References Cited

FOREIGN PATENT DOCUMENTS

| | | |
|---|---|---|
| GB | 2131748 A | 6/1984 |
| JP | H01274432 A | 11/1989 |
| JP | H04133327 A | 5/1992 |
| KR | 20140010535 A | 1/2014 |

OTHER PUBLICATIONS

English machine translation of KR101364741 (corresponding to KR 20140010535) published Jan. 27, 2014 retrieved on Apr. 5, 2024 (Year: 2014).*

Nykanen et al. ("Nykanen" Nykanen, H. "Low energy electron beam induced vacancy activation in GaN" App. Phys. Lett. 100 Mar. 21, 2012 pp. 122105-1 through 122105-3) (Year: 2012).*

Dassonneville et al. ("Dassonneville" Dassonneville, S. "Cathodoluminescence of epitaxial GaN laterally overgrown on (0001) sapphire substrate. Time evolution with low energy electron beam" Jour. of App. Phys. vol. 89, No. 12 Jun. 15, 2001 pp. 7966-7972) (Year: 2001).*

Tsai et al. ("Tsai" Tsai, M-C "Understanding and Predicting GaN Anisotropic Wet Etch Facet Evolution" Conference Presentation for Elec. Mat. Conf. in Newark Delaware Jun. 1, 2016 pp. 1-26 (Year: 2016).*

Amano H. et al., "P-Type Conduction in Mg-Doped GaN Treated with Low-Energy Electron Beam Irradiation (LEEBI)", Japanese Journal of Applied Physics, vol. 28, No. 12, Dec. 1989, pp. L2112-L2114, total 3 pages.

Gao, Y. et al., "Enhanced Wet Etching of Patterned GaN with Heavy-Ion Implantation", IEEE, 2010, total 2 pages.

Cheng-Che H. et al., "Enhanced Wet Etching of Patterned GaN with Heavy-Ion Implantation", NSTI-Nanotech, vol. 2, 2010, 249-252, total 4 pages.

Park J. et al., "Dopant-dependent chemical wet etching phenomena of semipolar (11-22) GaN film", total 2 pages.

Richter G. et al., "High-resolution patterning of semiconductors using electron-beam-assisted wet etching", Applied Physics Letters, vol. 81, No. 9, Aug. 26, 2002, 1693-1695, total 3 pages.

Rykaczewski K. et al., "Maskless and Resist-Free Rapid Prototyping of Three-Dimensional Structures Through Electron Beam Induced Deposition (EBID) of Carbon in Combination with Metal-Assisted Chemical Etching (MaCE) of Silicon", Applied Material & Interfaces, vol. 2, No. 4, 2010, p. 969-973, total 5 pages.

Stocker D. A. et al., "Crystallographic wet chemical etching of GaN", Applied Physics Letters, vol. 7, No. 18, Nov. 2, 1998, 2654-2656, total 3 pages.

Tada T. et al., "AlN as a Dry-Etch Durable Resist for Electron and Ion Beam Lithography", Japanese Journal of Applied Physics, vol. 32, No. 3B, Part 2, Mar. 15, 1993, pp. L458-L460, total 4 pages.

Utke I. et al., "Gas-assisted focused electron beam and ion beam processing and fabrication", J. Vac. Sci. Technol., vol. B 25, No. 4, Jul./Aug. 2008, pp. 1197-1276, total 80 pages.

Wang Y. et al., "Fabrication and characterization of freestanding circular GaN gratings", Optics Express, vol. 18, No. 2, Jan. 18, 2010, pp. 773-779, total 7 pages.

\* cited by examiner

METHOD FOR STRUCTURING A SEMICONDUCTOR SURFACE AND SEMICONDUCTOR BODY COMPRISING A SEMICONDUCTOR SURFACE HAVING AT LEAST ONE STRUCTURE

This patent application is a national phase filing under section 371 of PCT/EP2020/056911, filed Mar. 13, 2020, which claims the priority of German patent application 102019106964.5, filed Mar. 19, 2019, each of which is incorporated herein by reference in its entirety.

TECHNICAL FIELD

A method for structuring a semiconductor surface and a semiconductor body comprising a semiconductor surface having at least one structure are specified.

SUMMARY

Embodiments provide a method for structuring a semiconductor surface which enables simplified structuring of a semiconductor surface of a semiconductor body. Further embodiments provide a semiconductor body comprising a semiconductor surface structured in this way.

Various embodiments provide a method for structuring a semiconductor surface. Structuring a semiconductor surface involves the targeted and controlled production of structures on the surface of a semiconductor layer. The semiconductor layer can be part of a semiconductor body or form a semiconductor body. The structuring changes in particular the topography of the semiconductor surface. A structure produced by the structuring can for example be accentuated in particular vis-à-vis the semiconductor surface in direct proximity to the structure and project beyond regions of the semiconductor surface that are arranged adjacent to it. By way of example, the structure can form an elevation.

In accordance with one aspect of the method for structuring a semiconductor surface, the method comprises providing a semiconductor surface. The semiconductor surface can be part of a semiconductor layer. The semiconductor layer can be grown epitaxially. The semiconductor layer can be a constituent part of an optoelectronic component and comprise an active region used for generating and/or detecting radiation. The semiconductor layer can have an outer surface that is exposed. The semiconductor surface is formed by said outer surface or a part of the outer surface. In particular, the semiconductor surface can be part of an n-conducting region, of a nominally undoped region or of a p-conducting region of the semiconductor layer. In particular, the semiconductor surface can be embodied as a light exit and/or light entrance surface.

In accordance with one aspect, the method comprises irradiating the semiconductor surface with an electron beam in order to produce an irradiated section.

An electron beam is in particular a technically generated beam of electrons with defined properties, for example an energy and an extent on the semiconductor surface. The extent of the electron beam on the semiconductor surface corresponds to the width of the electron beam perpendicular to the beam direction. It can be circular or approximately circular and can be described by way of a diameter.

A section is defined in particular as a spatially delimited region of the semiconductor surface. In particular, a section is embodied as a segment of the totality of the semiconductor surface.

The irradiation of the section of the semiconductor surface is effected by way of moving the electron beam over the entire area of the section that is intended to be irradiated.

During the irradiation of the semiconductor surface with an electron beam, an interaction between the electrons of the electron beam and the semiconductor surface can occur. Interaction can be understood to mean, for example, scattering of the electrons at the surface and/or trapping of the electrons in the semiconductor layer and/or activation of point defects by the influence of the electrons.

The interaction between the electrons of the electron beam and the semiconductor surface can for the most part be independent of the irradiation direction and the irradiation angle. That means that no preferred direction then exists during the irradiation of sections. In this case, the interaction between the electrons of the electron beam and the semiconductor surface is not dependent on the crystal structure of the semiconductor layer.

The interaction between the electrons of the electron beam and the semiconductor surface can be amplified by focusing the electron beam onto the semiconductor surface. Focusing reduces the extent of the electron beam on the semiconductor surface, as a result of which more electrons are radiated onto a smaller area and the interaction can increase. In particular, it is possible for a detectable interaction to occur only upon the focusing of the electron beam.

Any section of the semiconductor surface which comes into direct contact with the electron beam and in which an interaction takes place forms an irradiated section. Direct contact between semiconductor surface and electron beam means that electrons impinge directly on the semiconductor surface. The irradiated section has at least the extent of the electron beam on the semiconductor surface. It can comprise for example a point or a curve on the semiconductor surface. A section that was not irradiated by the electron beam is an unirradiated section.

In accordance with one aspect, the method comprises wet-chemical etching of the semiconductor surface. Wet-chemical etching processes can be anisotropic. Wet-chemical etching means that the etching substance is an etching liquid. The semiconductor surface is thus treated with an etching liquid. In particular, the semiconductor surface is brought into direct contact with the etching liquid. In this case, constituents of the semiconductor surface can be removed and/or dissolved. In particular, constituents of the semiconductor layer are removed from the semiconductor layer from the surface. By way of example, the semiconductor material of the semiconductor surface can be oxidized by the etching substance and subsequently be dissolved.

The removal of the semiconductor surface during the etching process can be influenced by a large number of process-dependent variables, for example by the etching substance used, the concentration of the etching substance, the temperature of the etching substance and/or the etching duration. The intensity of the etching process can be described by way of an etching rate. The etching rate describes the relationship between the amount of material removed and etching duration, that is to say the time when the surface is exposed to the etching substance. The more material is removed per unit time, the greater the etching rate, and vice versa. The etching rate can be influenced by the process-dependent variables of the etching process. By way of example, an increased concentration or temperature of the etching substance or a lengthened etching duration can result in a greater removal from the semiconductor surface. With constant etching conditions and comparable surfaces, the etching process can take place with comparable etching rates.

By means of wet-chemical etching, a structuring, for example a roughening, of a semiconductor surface can be achieved if not all sections of the semiconductor surface are removed uniformly and equally. Nonuniform removal of the semiconductor surface can be caused by a large number of material-dependent variables, for example crystal defects, incorporated impurity atoms and/or dopants or the growth conditions during the production of the semiconductor layer. The roughenings that arise can consist for example of pyramidal elevations on the semiconductor surface. They can arise as a result of reduced removal at this location of the semiconductor surface. The elevations that arise are therefore not applied to the existing surface, rather the existing surface is partly removed, as a result of which elevations remain at locations with reduced removal.

The process-dependent variables of the etching process, just like the material-dependent variables, determine the size of the elevations that arise. An increased temperature or an increased concentration of the etching liquid and also a lengthened etching duration can result in an increased etching rate and hence in a formation of larger elevations. Since the material-dependent variables determine the locations on the semiconductor surface at which elevations arise, the roughening of an untreated, in particular unirradiated, semiconductor surface by means of wet-chemical etching is random and takes place in an uncontrolled manner.

In accordance with a further aspect, the etching rate in the irradiated section is less than in an unirradiated section of the semiconductor surface. In this case, the entire semiconductor surface is subjected to the same etching process. In other words, therefore, in this case the process-dependent variables do not determine the etching rate, rather the different etching rates at different locations of the semiconductor surface are caused by material-dependent variables. By irradiating the semiconductor surface with an electron beam, it is possible to change the properties of the semiconductor surface in the irradiated section such that the etching process is slowed down in this section. In other words, the etching rate is reduced in the irradiated section. The etching is accordingly less pronounced in the irradiated section, which means that the material of the semiconductor surface is removed and/or dissolved to a lesser extent in the irradiated section compared with in the unirradiated section. In particular, the irradiated section of the semiconductor surface after etching can form a structure and be elevated relative to the unirradiated sections of the semiconductor surface.

The structures have base areas on the semiconductor surface and can taper with increasing distance from the base area. The structures can have a second area arranged parallel or approximately parallel to the base area. The second area can be the top area of the structure facing away from the base area. In this case, the top area of the structures on the irradiated semiconductor surface corresponds at least approximately to the area of the irradiated section. In particular, the top area of the structures can have a larger area than the area of the irradiated section.

In particular, the top areas of the structures can be smaller than the base areas of the structures on the semiconductor surface with regard to their surface area. This can result in the formation of oblique interfaces between the irradiated and unirradiated sections, for example the formation of structures similar to truncated cones or truncated pyramids. The elevated irradiated sections can be randomly roughened. The roughenings can be produced by the etching process.

Since the etching processes can take place with reduced etching rates in irradiated sections, the roughenings in irradiated sections can have a smaller size than those in unirradiated sections.

In accordance with one aspect of the method for structuring a semiconductor surface, the method comprises the following steps:
providing the semiconductor surface, wherein the semiconductor surface is part of a semiconductor layer,
irradiating the semiconductor surface with an electron beam in order to produce an irradiated section,
wet-chemical etching of the semiconductor surface, wherein
the etching rate in the irradiated section is less than that in an unirradiated section of the semiconductor surface.

The method steps of the method for structuring a semiconductor surface as described here are not fixed to this order. In accordance with one preferred aspect, however, they take place in this order. In particular, irradiating the semiconductor surface can be carried out before the wet-chemical etching.

The method is based on the insight, in particular, that a targeted incidence of electrons causes a local change in the material of a semiconductor surface, as a result of which a targeted structuring of the semiconductor surface is achieved in the context of a wet-chemical etching process previously proceeding in an uncontrolled manner. The semiconductor surface can be structured regularly and in a controlled manner and the structuring of the semiconductor surface can be carried out reproducibly by way of a wet-chemical etching process. In particular, structures that are accentuated vis-à-vis adjacent regions of the semiconductor surface arise in this case. Conventionally, such accentuated structures can be produced by way of dry-chemical etching using an etching mask. The advantages of wet-chemical etching are very good cost-effectiveness by virtue of a possible batch process and dispensing with an often cost-intensive etching mask, and also no remaining degradation products whatsoever. The irradiation with electrons is furthermore more cost-effective than ion bombardment conventionally used, which moreover results in removal of the semiconductor surface to a greater extent, rather than to a lesser extent.

One possible explanation for the lower etching rate in the irradiated sections of the semiconductor surface may be the activation of point defects in the semiconductor layer. Epitaxially grown semiconductor layers may contain intrinsic point defects, which can be passivated after epitaxial growth by hydrogen or precursor degradation products. For example, the energy input resulting from the electron beam can activate these passivated point defects and thereby produce additional electronic states in the material of the semiconductor layer. The change in the electronic properties of the semiconductor layer could cause a lower etching rate. By way of example, a lower rate of the rate-determining hydroxide attack is possible with the use of an alkaline solution.

Alternatively or additionally, an introduced negative charge, for example as a result of trapping of electrons from the electron beam, in the irradiated sections of the semiconductor surface could result in a lower etching rate. By way of example, a lower rate of the rate-determining hydroxide attack is then possible with the use of an alkaline solution.

In accordance with one aspect of the method for structuring a semiconductor surface, the semiconductor layer comprises a III/V semiconductor. A III/V semiconductor comprises at least one element from the $3^{rd}$ main group, such as B, Al, Ga, In, and an element from the $5^{th}$ main group, such as N, P, As, for example. In particular, the term III/V semiconductor encompasses the group of binary, ternary or quaternary compounds which contain at least one element from the $3^{rd}$ main group and at least one element from the $5^{th}$ main group, such as nitride or phosphide semiconductors, for example. Such a binary, ternary or quaternary compound can additionally comprise for example one or more dopants and additional constituents.

During the wet-chemical etching of a III/V semiconductor surface, a roughening of the semiconductor surface takes place. The elevations that arise on the semiconductor surface are dependent on the lattice structure of the semiconductor material and can be pyramidal, for example. The pyramidal elevations can be for example hexagonal pyramids having {10-1-1} crystal facets as sidewalls of the pyramids.

In accordance with one aspect of the method, the semiconductor layer comprises a nitride semiconductor. In other words, the semiconductor layer is thus based on a nitride semiconductor material. In the present context, based on nitride semiconductor material means that the semiconductor layer sequence or at least one part thereof comprises or consists of a nitride semiconductor material, preferably $Al_nGa_mIn_{1-n-m}N$, wherein $0 \leq n \leq 1$, $0 \leq m \leq 1$ and $n+m \leq 1$. In this case, this material need not necessarily have a mathematically exact composition according to the above formula. Rather, it can comprise for example one or more doped substances and additional constituents. For the sake of simplicity, however, the above formula includes only the essential constituents of the crystal lattice, even if these can be replaced and/or supplemented in part by small amounts of other substances. For example, the semiconductor layer can be a GaN semiconductor.

In accordance with one aspect of the method, the parameters of the irradiation of the semiconductor surface with the electron beam can be varied. A variation of the parameters both of the electron beam and of the irradiation process is possible. Parameters of the electron beam which can be varied are for example the diameter of the electron beam and/or the electron energy. Parameters of the irradiation process which can be varied are for example the irradiation duration and/or the speed at which the electron beam is moved over the semiconductor surface. In this case, the parameters can optionally be changed or kept constant during the irradiation. In particular, the irradiation can be carried out with parameters defined before the beginning of the irradiation.

In accordance with one aspect of the method, the diameter of the electron beam can be varied. The larger the diameter of the electron beam, the wider and thus the larger the irradiated section on the semiconductor surface. The diameter of the electron beam can be for example between 10 nm and 50 nm inclusive. By way of example, the diameter of the electron beam can be 20 nm. The smaller the diameter of the electron beam and thus the possible width of an irradiated section are, the smaller the elevated top area of the structures that arise can be. In particular, the structures can taper to a point, which can directly positively influence the contrast of the coupling out of light in a lateral direction.

In accordance with one aspect of the method, the energy of the electron beam can be varied. The greater the energy of the electron beam, the greater the increase in the average energy of the incident electrons and also the number and energy of the excited secondary electrons in the semiconductor. A greater energy of the electron beam can also result in a greater penetration depth of the electrons into the material of the semiconductor surface, and vice versa. The energy of the electron beam can be between 1 keV and 200 keV inclusive. By way of example, the energy of the electron beam is 5 keV, 8 keV, 10 keV or 12 keV.

Surprisingly, it has been found that a variation of the energy of the electron beam, at least in the specified region, does not result in a change at the structures produced. One possible explanation for this is that this is purely a surface phenomenon and the semiconductor surface is protected by the interaction between the electrons of the electron beam and the material of the semiconductor surface in the subsequent etching process, such that regions of the semiconductor layer which adjoin the semiconductor surface do not come into direct contact with the etching substance. Consequently, the penetration depth of the electrons into the material of the semiconductor surface has no or at least no detectable effect.

In accordance with one aspect of the method, the irradiation duration of the semiconductor surface can be varied. The longer the semiconductor surface is irradiated with the electron beam, the greater the number of electrons radiated onto the semiconductor surface. The irradiation duration of the semiconductor surface with the electron beam can be greater than or equal to 10 ms. A longer irradiation time of the semiconductor surface can result in lesser removal from the irradiated sections of the semiconductor surface during a subsequent etching process. A shorter irradiation duration results in a shorter process time, which is advantageous in productive applications.

The irradiation duration of the semiconductor surface can be influenced by way of the speed at which the electron beam is moved over the semiconductor surface. The more slowly the electron beam is moved over the semiconductor surface, the longer the respective section of the semiconductor surface is irradiated. Accordingly, a high speed of the electron beam results in a short irradiation duration. An irradiation along a line or a curve on the semiconductor surface can be carried out with different speeds and thus different irradiation durations. As a result, it is possible to obtain for example different structures within an irradiated section.

In accordance with one aspect of the method, the wet-chemical etching of the semiconductor surface is carried out with an alkaline solution. That means that an alkaline solution is used as etching liquid for the etching process. In particular, the wet-chemical etching of the semiconductor surface can be carried out with KOH, NaOH, $NH_3$ or TMAH.

In accordance with one aspect of the method, the wet-chemical etching of the semiconductor surface is carried out with an acid. That means that an acid is used as etching liquid for the etching process. In particular, the wet-chemical etching of the semiconductor surface can be carried out with phosphoric acid ($H_3PO_4$).

In accordance with one aspect of the method, the etching duration is varied. The etching duration influences the elevation of the irradiated sections vis-à-vis the unirradiated sections and also the intensity of the random roughening of the semiconductor surface. The longer the semiconductor surface is etched, the greater the material removal and thus also the random roughening of the semiconductor surface in the unirradiated sections. Conversely, a short etching duration has the result that the random roughening on the semiconductor surface in the unirradiated sections is small and the irradiated sections stand out clearly against the semiconductor surface. The etching duration can be between 1 minute and 30 minutes inclusive. By way of example, the etching duration is 6 minutes.

In accordance with one aspect, no etching mask is applied to the semiconductor surface before the wet-chemical etching. Applying an etching mask means that before the etching a mask material, for example a photoresist, is applied in a targeted manner to the sections of a semiconductor surface which are not intended to be etched, and is subsequently exposed. In anisotropic etching methods, for example wet-chemical etching, undercuts can occur when an etching mask is used.

In the case of the method described here, an etching mask, in particular mask material, is applied to the semiconductor surface neither before the irradiation of the semiconductor surface nor before the wet-chemical etching. In other words, the semiconductor surface is free of a mask layer and/or a mask material and/or deposits, in particular organic deposits, and/or residues, in particular organic residues, before and after the irradiation and before the wet-chemical etching.

In particular, the irradiated sections have no undercuts. On the contrary, with increasing distance from the semiconductor surface, the structures can taper and form structures similar to truncated cones or truncated pyramids, for example. By way of example, it is possible for unirradiated sections of the semiconductor surface adjoining irradiated sections not to be etched vertically, rather pyramid sidewalls can develop on account of the particular stability of the {10-1-1} faces.

In the case of the method described here, the irradiated sections are etched with a lower etching rate than the unirradiated sections. In other words, etching removal is produced in the irradiated sections as well. The etching is reduced in the irradiated sections, but not completely prevented. Consequently, the semiconductor surface is no longer in the original state that it had before the etching. With the use of an etching mask, the original semiconductor surface below the etching mask would not be attacked by the etching liquid and would remain in the original state.

In accordance with one aspect of the method, the electron beam is guided on the semiconductor surface along a curve. Consequently, in at least one direction of extent the irradiated sections have an extent which is greater than the extent of the electron beam. By guiding the electron beam along curves adjoining one another on the semiconductor surface, it is possible to irradiate sections which comprise an area. In this case, the shape of the irradiated sections is not fixed. By way of example, the semiconductor surface can be irradiated along geometric figures or segments or sectors of geometric figures. Structures having these shapes can arise on the semiconductor surface as a result of the subsequent etching process.

In accordance with one aspect of the method for structuring a semiconductor surface, a plurality of parallel sections of the semiconductor surface are irradiated with an electron beam, wherein the parallel sections have a common main direction of extent. In this case, parallel sections are arranged next to one another and are at the same distance from one another at every point within the scope of the method-dictated accuracy. Parallel irradiated sections have a length and a width. In this case the length of the irradiated parallel sections should be understood as the extent in the common main direction of extent. In this direction the extent of the irradiated sections is greater than the extent of the electron beam on the semiconductor surface. The width of the irradiated parallel sections corresponds at least to the extent of the electron beam on the semiconductor surface. In particular, each of the irradiated parallel sections can be produced by guiding the electron beam along a curve or line in the main direction of extent on the semiconductor surface.

By way of example, it is possible to irradiate linear parallel sections on the semiconductor surface. As a result of the subsequent etching process, for example, prism-shaped structures having an approximately triangular base area can arise, particularly if the width of the irradiated parallel sections corresponds to the extent of the electron beam on the semiconductor surface. Prism-shaped structures are characterized in particular in that they taper to a point, which can directly positively influence the contrast of the coupling out of light in a lateral direction.

During the irradiation, the parallel sections of the semiconductor surface, perpendicular to the main direction of extent, can be so far away from one another that the structures that arise as a result of the etching process on the semiconductor surface do not touch one another. In this case, an additional random and uncontrolled roughening of the semiconductor surface in the unirradiated sections can occur during the etching process. Alternatively, it is possible to choose the distances between the irradiated parallel sections perpendicular to the main direction of extent such that the structures that arise as a result of the etching process on the semiconductor surface touch one another. The random and uncontrolled roughening can be at least reduced as a result.

In accordance with one aspect, at least one ring-shaped section of the semiconductor surface is irradiated with the electron beam. A ring-shaped section surrounds an approximately circular section that is not irradiated or is only partly irradiated. The irradiated ring-shaped section has at least the width of the extent of the electron beam on the semiconductor surface. In other words, an annulus can be irradiated. The subsequent etching process can give rise to a structure on the semiconductor surface that approximately forms an annulus. If the width of the irradiated section corresponds to the extent of the electron beam on the semiconductor surface, the structure can be prism-shaped, in particular. The prism-shaped structure can directly positively influence the contrast of the coupling out of light in a lateral direction.

In accordance with a further aspect, at least two ring-shaped sections of the semiconductor surface are irradiated with the electron beam. The irradiated ring-shaped sections can be arranged such that they touch one another at one location or intersect at two locations or lie next to one another in such a way that no touching or intersection locations are present.

In accordance with a further aspect, the radii of the irradiated rings differ from one another. The irradiated ring-shaped sections can then both lie next to one another and lie one in another. The irradiated ring-shaped sections can touch one another at one location or intersect at two locations or lie next to one another or one in another in such a way that no touching or intersection locations are present.

In accordance with a further aspect, at least two concentric ring-shaped sections of the semiconductor surface are irradiated with the electron beam. Concentric ring-shaped sections each comprise an approximately circular section, have mutually different radii and lie one in another such that they have a common centroid. In particular, said common centroid is the center point of the at least two ring-shaped sections. Within the scope of the method-dictated accuracy, concentric ring-shaped sections are at the same distance from one another on account of their arrangement with respect to one another.

The radii of the irradiated concentric ring-shaped sections can be chosen such that the structures that arise as a result of the etching process on the semiconductor surface do not touch one another. In this case, an additional random and uncontrolled roughening of the semiconductor surface in the unirradiated sections can occur during the etching process. Alternatively, the radii of the irradiated concentric ring-shaped sections can be chosen such that the structures that arise as a result of the etching process on the semiconductor surface touch one another. The random and uncontrolled roughening can be at least reduced as a result. By way of example, concentric ring-shaped structures on the semiconductor surface can be suitable as an optical lens.

In accordance with one aspect of the method, a punctiform irradiation of the semiconductor surface with the electron beam is carried out. In the case of a punctiform irradiation of the semiconductor surface, the electron beam is not guided over the semiconductor surface, rather a section of the semiconductor surface that corresponds to the extent of the electron beam on the semiconductor surface is irradiated. In other words, therefore, a circular section of the semiconductor surface with the diameter of the electron beam is irradiated. Afterward, the electron beam is turned off or the beam path is blocked, such that no electrons can impinge on the semiconductor surface. A different section of the semiconductor surface can subsequently be irradiated in the same way.

In the case of a punctiform irradiation of the semiconductor surface, the subsequent etching process in the irradiated section can give rise to a structure which can be embodied in pyramidal fashion and can be accentuated to a greater extent vis-à-vis the random roughening of the semiconductor surface. In particular, the pyramidal structure can have a flattened vertex or top area, which can be split and/or roughened. In order to reduce a random and uncontrolled roughening of the semiconductor surface, a plurality of circular sections of the semiconductor surface can be irradiated in punctiform fashion. By way of example, a plurality of circular sections at uniform distances from one another can be irradiated in punctiform fashion. Alternatively or additionally, a plurality of circular sections at quasi-regular distances from one another can be irradiated in punctiform fashion. Here and hereinafter, quasi-regular distances should be understood to mean a randomized displacement of the individual points of an intrinsically regular point pattern. The quasi-regular arrangement of structures on a semiconductor surface is described in PCT/EP2018/073625, the disclosure content of which is hereby incorporated by reference.

By way of example, the distances between the irradiated circular sections can be chosen such that the structures that arise as a result of the etching process on the semiconductor surface touch one another. A directional and reproducible roughening and structure size can thus be achieved. Without irradiation before the roughening process, the random material-dependent fluctuation can result in an uncontrollable process with random pyramid heights at random positions.

Further embodiments provide a semiconductor body comprising a semiconductor surface having at least one structure. In this case, the at least one structure can be produced in particular by a method described here. That is to say that all features disclosed for the method are disclosed for the semiconductor body, and vice versa.

The semiconductor body comprises at least one semiconductor layer which can be a constituent part of an optoelectronic component and can comprise an active region used for generating and/or detecting radiation. The semiconductor layer can be grown epitaxially. In particular, the semiconductor layer can have an n-conducting region, a nominally undoped region or a p-conducting region. The surface of the semiconductor body can comprise an outer surface or the part of an outer surface of the semiconductor body. Here and hereinafter, the surface of the semiconductor body can also be referred to as semiconductor surface. In particular the semiconductor surface can be part of an n-conducting region, of a nominally undoped region or of a p-conducting region of the semiconductor layer. In particular, the semiconductor surface can be embodied as a light exit and/or light entrance surface. A semiconductor surface having a structure has a changed topography. A structure on a semiconductor surface can for example be accentuated vis-à-vis the semiconductor surface in direct proximity to the structure and can project beyond regions of the semiconductor surface that are arranged adjacent to it. By way of example, the structure can form an elevation.

In accordance with one embodiment, the at least one structure consists of a material of the topmost layer of the semiconductor surface. The at least one structure is chemically bonded to the material of the semiconductor surface. In particular, the at least one structure can be bonded to the material of the semiconductor surface for example via mixed covalent-ionic chemical bonds.

In accordance with one embodiment, the at least one structure is embodied as a curve or point. The at least one structure can comprise for example a plurality of points arranged along grid points of a regular or quasi-regular grid. "Regular grid" means that the arrangement of the curves or points can be described by a uniform recurrence or succession of the curves or points within the scope of the implementation accuracy. The lateral extent of the curves or points corresponds at least to the extent of the electron beam on the semiconductor surface. It can be greater than the extent of the electron beam in at least one direction of extent. The regular curves or points can be accentuated vis-à-vis the rest of the semiconductor surface and can project beyond regions of the semiconductor surface that are arranged adjacent to them.

The structures have base areas on the semiconductor surface and can taper with increasing distance from the base area. The structures can have a top area arranged parallel or approximately parallel to the base area. In particular, the top areas of the structures can be smaller than the base area of the structure on the semiconductor surface. This can result in the formation of oblique interfaces between the top areas of the structures and the semiconductor surface, for example in the formation of structures similar to truncated cones or truncated pyramids. By way of example, pyramid sidewalls can develop on account of the particular stability of the {10-1-1} faces.

In accordance with one embodiment, the at least one structure is produced wet-chemically without the use of an etching mask. In this case, "wet-chemical production" means that the semiconductor surface was treated with a liquid that can cause structures on the semiconductor surface, for example by removal of parts of the semiconductor surface. Wet-chemical processes can proceed without residues remaining. In particular, the structures are produced by way of anisotropic wet-chemical etching. When an etching mask is used, undercuts can occur in the case of anisotropic etching methods. "Producing structures without use of an etching mask" means that an etching mask, in particular a mask material, for example a photoresist, is not applied in a targeted manner on the semiconductor surface. In particular, the structures have no undercuts. On the contrary, the structures can taper with increasing distance from the semiconductor surface and can be embodied as structures similar to truncated cones or truncated pyramids, for example. The top areas of the structures can be roughened randomly by the wet-chemical etching. The roughenings on the top areas of the structures can have a smaller size than the roughenings on the semiconductor surface.

In accordance with one embodiment, a semiconductor surface of a semiconductor body has at least one structure, wherein
- the at least one structure consists of a material of the topmost layer of the semiconductor surface,
- the at least one structure is embodied as a curve or point, and
- the at least one structure is produced wet-chemically without use of an etching mask.

The at least one structure on a semiconductor surface of a semiconductor body is used for example to cause directional coupling out of light.

In accordance with one embodiment, at least two structures are arranged as linear and/or parallel structures. In this case, parallel structures are arranged next to one another and are at the same distance from one another at every point within the scope of the implementation-dictated accuracy. Linear structures are arranged rectilinearly along a common main direction of extent. In particular, the linear and/or parallel structures can have a prism-shaped extent with an approximately triangular base area. The prism-shaped structures can arise as a result of superimposed, pyramidal structures having a hexagonal or dodecagonal base area on the semiconductor surface. The prism-shaped structures can directly positively influence the contrast of the coupling out of light in a lateral direction.

The linear and parallel structures can be so far apart from one another on the semiconductor surface perpendicular to the main direction of extent that the structures on the semiconductor surface do not touch one another. In addition to the linear and parallel structures, random roughenings of the semiconductor surface around and between the linear and parallel structures can then occur. Alternatively, the distances between the linear and parallel structures on the semiconductor surface perpendicular to the main direction of extent can be so small that the structures on the semiconductor surface touch one another. As a result, the additional random roughening can be at least reduced and the coupling out of light can be improved.

In accordance with one embodiment, at least two structures are arranged as concentric ring-shaped structures. Ring-shaped structures comprise an approximately circular section. The approximately circular section comprised can be non-roughened, randomly roughened or structured in a controlled manner. By way of example, the approximately circular section comprised by a first ring-shaped structure can be structured in a controlled manner by at least one further ring-shaped structure having a smaller radius.

Concentric ring-shaped structures each comprise an approximately circular section, have mutually different radii and lie one in another such that they have a common centroid. In particular, said common centroid is the center point of the concentric ring-shaped structures. Within the scope of the implementation accuracy, concentric ring-shaped structures are at the same distance from one another on account of their arrangement with respect to one another.

In particular, the ring-shaped structures can be prism-shaped with an approximately triangular base area.

The distances between the concentric ring-shaped structures can be so large that the structures on the surface do not touch one another. In addition to the concentric ring-shaped structures, random roughenings can then be arranged on the semiconductor surface. Alternatively, the distances between the concentric ring-shaped structures can be chosen such that the structures on the semiconductor surface touch one another. The random roughening can be at least reduced as a result. By way of example, concentric ring-shaped structures on a semiconductor surface are suitable as an optical lens.

In accordance with one embodiment, a plurality of structures is arranged along a regular or quasi-regular grid and the structures consist of individual pyramidal structures caused. Said pyramidal structures do not necessarily have a hexagonal structure; rather, their base area on the semiconductor surface can correspond to an arbitrary polygon. In particular, the polygon can be embodied in symmetrical fashion and/or the pyramidal structures can be right structures. In particular, the pyramidal structures can have a flattened vertex or top area, which can be split and/or roughened.

A regular grid is characterized by a uniform recurrence of structures. The regular grid has at least two directions of extent which are perpendicular to one another. In this case, the distances between the individual pyramidal structures caused in the two directions of extent can differ from one another. Within a direction of extent, the distances between the individual pyramidal structures caused can be identical. Alternatively, the distances between the individual pyramidal structures caused can be quasi-regular. The individual pyramidal structures caused can touch one another on the semiconductor surface.

In accordance with one embodiment, the structures comprise or form an individual identifier on the semiconductor surface. This can be an identifier, for example having numbers and/or letters and/or symbols and/or machine-readable identifications, which can be read optically by way of microscopic methods, for example. By way of example, all chips of a wafer assemblage can be marked with an individual identifier. As a result, in the finished product, in the case of a quality problem, the origin of the chip can be traced back and possibly further affected chips can be identified.

BRIEF DESCRIPTION OF THE DRAWINGS

Further advantages and advantageous configurations and developments of the method for structuring a semiconductor surface and the semiconductor body will become apparent from the following exemplary embodiments illustrated in association with the figures.

DETAILED DESCRIPTION OF ILLUSTRATIVE EMBODIMENTS

Elements that are identical, of identical type or act identically are provided with the same reference signs in the figures. The figures and the size relationships of the elements illustrated in the figures among one another should not be regarded as to scale. Rather, individual elements may be illustrated with exaggerated size in order to enable better illustration and/or in order to afford a better understanding.

In the method in accordance with the exemplary embodiment in FIGS. 1A to 1D, firstly a semiconductor layer 1 comprising a semiconductor surface 2 is provided. The semiconductor layer 1 can be grown epitaxially and can comprise or consist of a III/V semiconductor, for example a nitride semiconductor such as GaN. It can be a constituent part of an optoelectronic component and comprise an active region used for generating and/or detecting radiation. The semiconductor surface 2 is formed by the exposed outer surface or a part of the exposed outer surface of the semiconductor layer 1. The semiconductor surface 2 can have in particular an n-conducting region, a nominally undoped region or a p-conducting region and can be embodied as a light exit and/or light entrance surface. This arrangement is shown schematically in FIG. 1A.

Figure 1A:
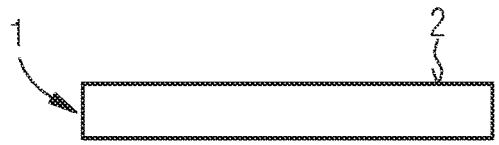
FIGS. 1A to 1D show a schematic illustration of the method for structuring a semiconductor surface in accordance with one embodiment.
Figure 1B:
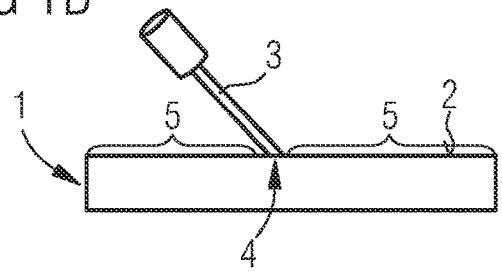

FIG. 1B schematically shows the process of irradiating the semiconductor surface 2 with an electron beam 3. The irradiation of the semiconductor surface 2 produces an irradiated section 4. The irradiated section 4 comprises at least the area corresponding to the extent of the electron beam 3. Sections that are not irradiated by the electron beam 3 are unirradiated sections 5.

Figure 1C:
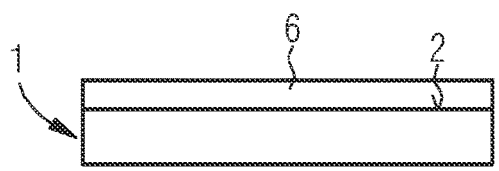

FIG. 1C shows the wet-chemical etching of the semiconductor surface 2. For this purpose, the surface 2 is brought into direct contact with an etching liquid 6, for example an alkaline solution.

Figure 1D:
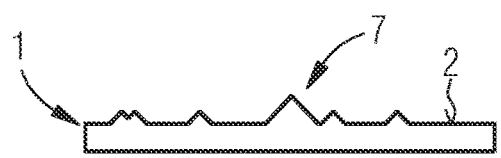

FIG. 1D shows the semiconductor layer 1 after the semiconductor surface 2 has been irradiated with the electron beam 3 and the semiconductor surface 2 has been etched with an etching liquid 6. The etching rate in the irradiated section 4 is significantly less than that in the unirradiated sections 5. This gives rise to a structure 7 that differs from the random roughening of the semiconductor surface 2 by virtue of a greater accentuation vis-à-vis the unirradiated sections 5, which were etched to a greater extent.

Figure 2A:
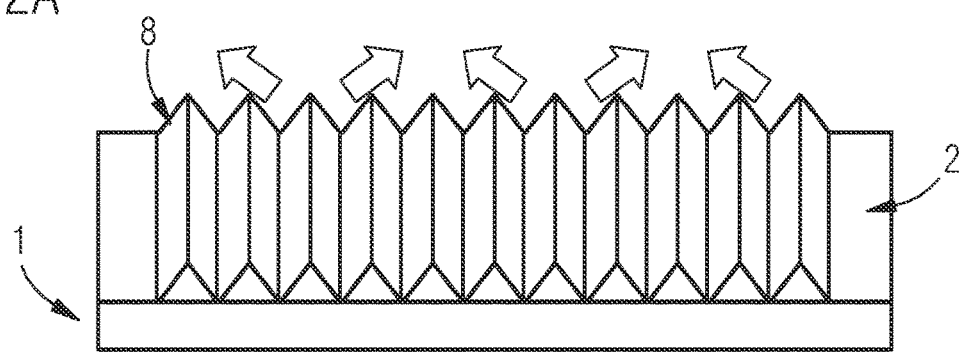
FIGS. 2A and 2B show a schematic illustration of parallel structures on a semiconductor surface of a semiconductor body in accordance with one embodiment.
Figure 2B:
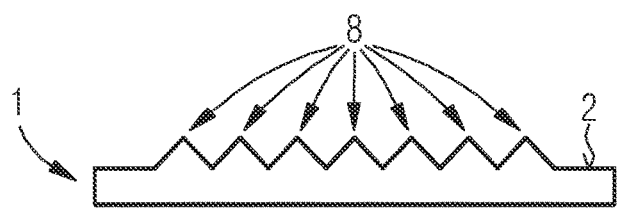

FIGS. 2A and 2B show a schematic illustration of parallel structures 8 on a semiconductor surface 2 of a semiconductor body in accordance with one embodiment. The parallel structures 8 have a common main direction of extent. The parallel structures 8 are embodied linearly in the main direction of extent and arranged in such a way that the prism-shaped linear and parallel structures 8 on the semiconductor surface 2 touch one another (FIG. 2A).

Figure 3A:
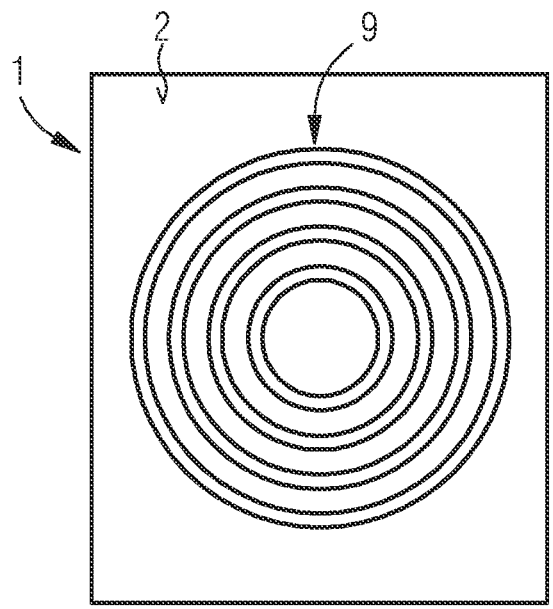
FIGS. 3A and 3B show a schematic illustration of ring-shaped structures on a semiconductor surface of a semiconductor body in accordance with one embodiment.
Figure 3B:
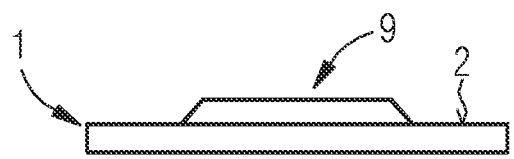

FIGS. 3A and 3B show a schematic illustration of ring-shaped structures 9 on a semiconductor surface 2 of a semiconductor body in accordance with one embodiment. The ring-shaped structures 9 are arranged concentrically and have different radii and a common centroid corresponding to the center point of the ring-shaped structures 9.

Figure 4:
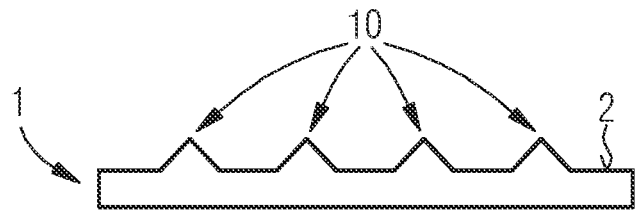
FIG. 4 shows a schematic illustration of pyramidal structures on a semiconductor surface of a semiconductor body in accordance with one embodiment.

FIG. 4 shows a schematic illustration of pyramidal structures 10 on a semiconductor surface 2 of a semiconductor body in accordance with one embodiment. The pyramidal structures 10 have a polygon, in particular a symmetrical polygon, as base area. By way of example, the pyramidal structures 10 can have a hexagonal or dodecagonal base area. In particular, etching with an alkaline solution such as KOH, TMAH or $NH_3$ can result in pyramidal structures 10 having a hexagonal base area and etching with an acid such as $H_3PO_4$ can result in pyramidal structures 10 having a dodecagonal base area. The pyramidal structures 10 are arranged along a regular grid having at least two directions of extent. In particular, the directions of extent are arranged perpendicular to one another. The distances between the pyramidal structures 10 can be identical within a direction of extent. The distances between pyramidal structures 10 within different directions of extent can differ from one another. In particular, the pyramidal structures 10 can be arranged quasi-regularly within the grid.

FIGS. 5A to 5E show scanning electron microscopy (SEM) micrographs of irradiated sections 4, unirradiated sections 5 and a structure 7 on a semiconductor surface 2 of a GaN semiconductor body in accordance with one embodiment. The semiconductor surface 2 was etched for 6 minutes in 30% by weight KOH at 80° C.

Figure 5A:
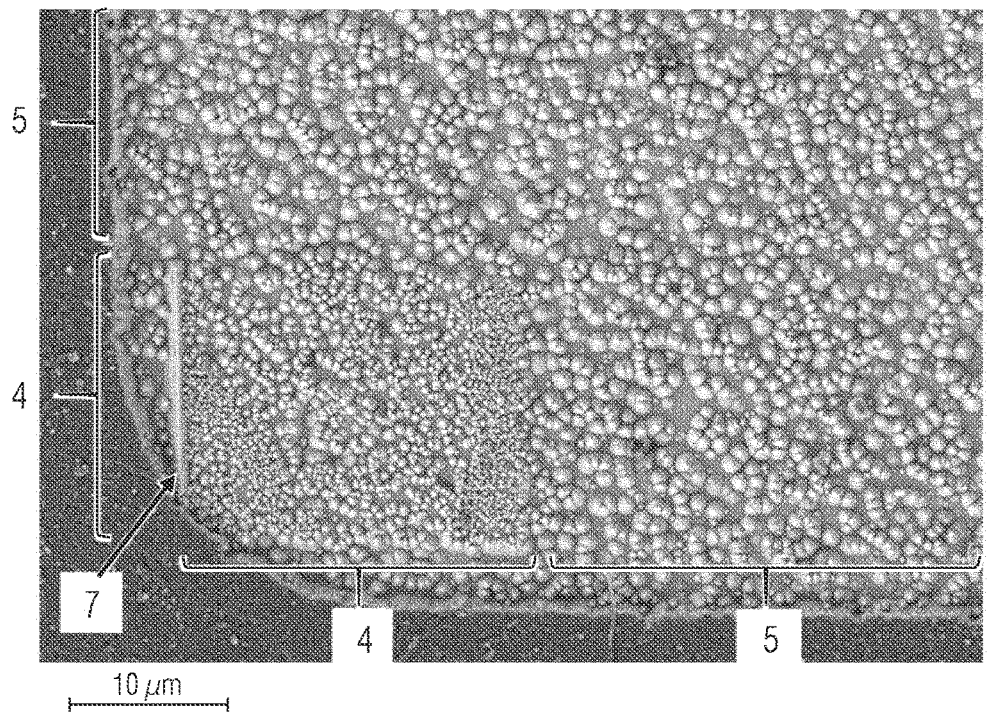
FIGS. 5A-5E and 6 show scanning electron microscopy (SEM) micrographs of structures on a semiconductor surface of a semiconductor body in accordance with various embodiments.
Figure 5B:
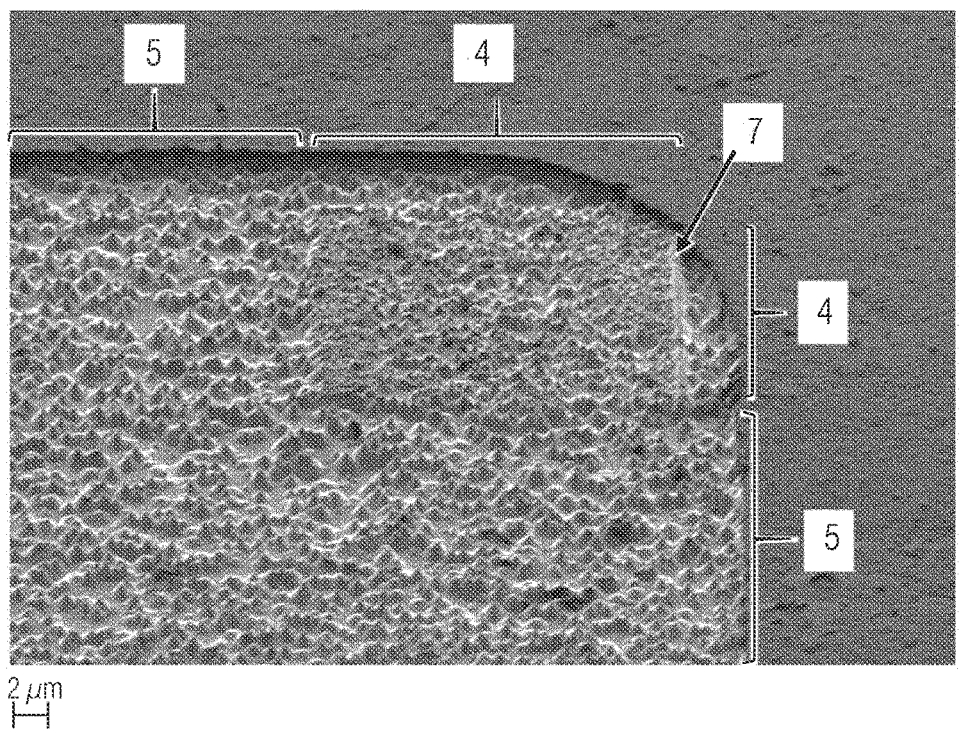
Figure 5C:
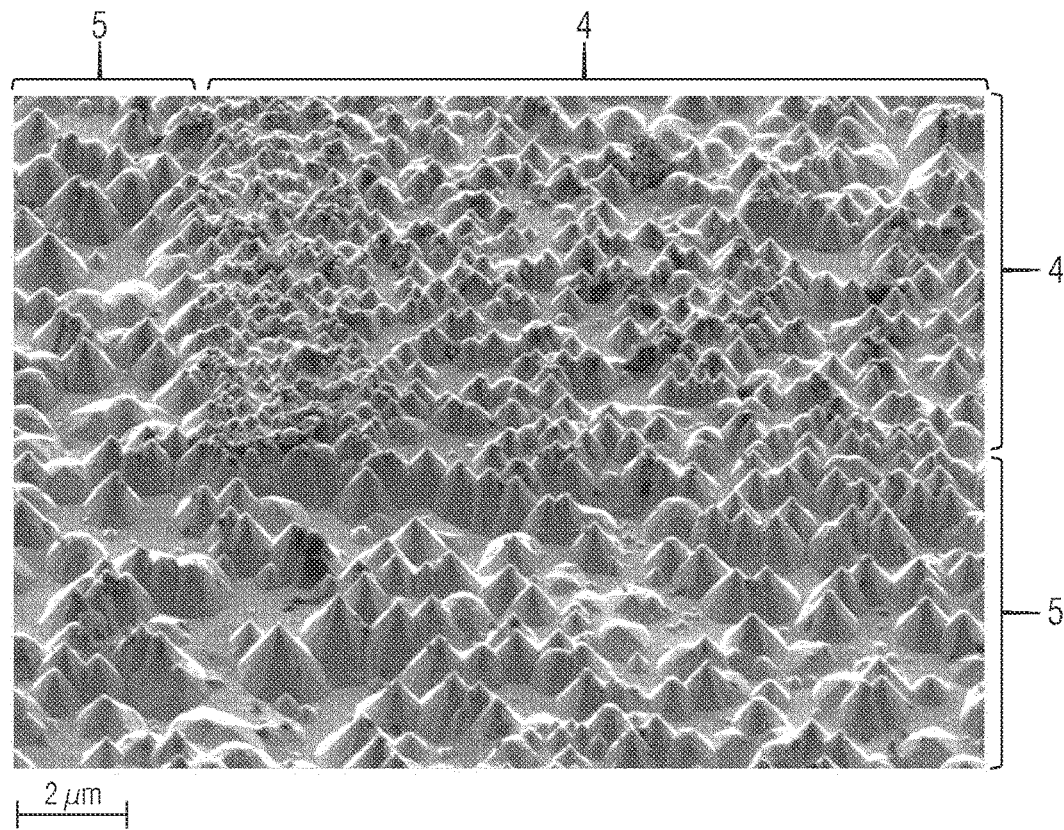

FIGS. 5A and 5B show a semiconductor surface 2 of a GaN semiconductor body and FIG. 5C shows a magnified view of FIG. 5A. The semiconductor surface 2 was partly irradiated with an electron beam 3 before etching. Less roughening of the semiconductor surface 2 and also a linear structure 7 can be discerned in the irradiated section 4.

Figure 5D:
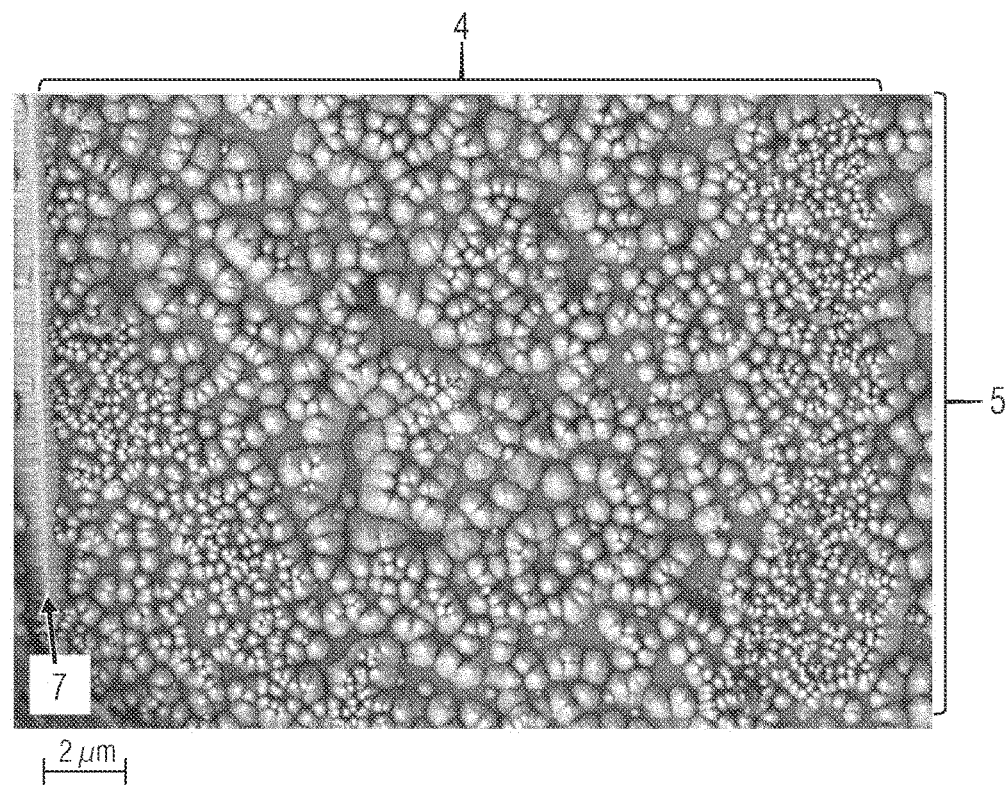
Figure 5E:
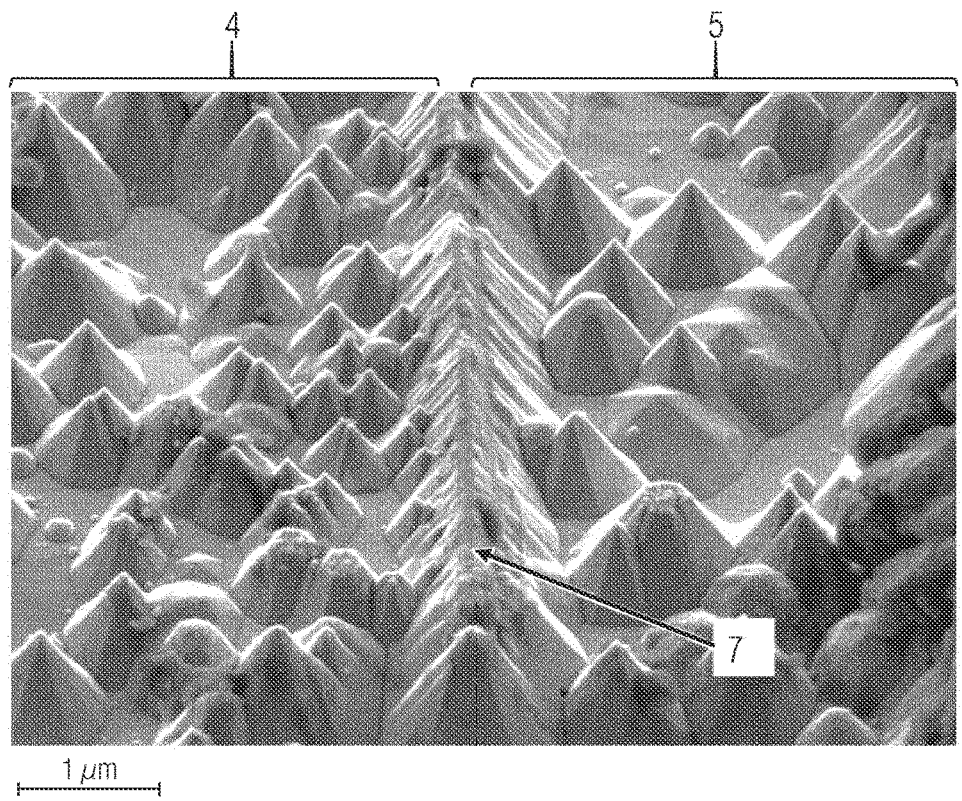

FIG. 5D shows the magnified view of the irradiated section 4 of the GaN semiconductor surface 2 from FIG. 5A. Acceleration and deacceleration of the electron beam 3 during irradiation is visualized in this figure. In this case, the electron beam 3 moved from the left edge on a horizontal line to the right edge of the irradiated section 4. The speed of the electron beam 3 initially increased during the movement on the horizontal line and decreased again before reaching the right edge of the irradiated section 4. The electron beam 3 momentarily remained stationary on the points at the left edge of the irradiated section 4 in order to store the recorded emission signal. The more slowly the electron beam 3 was moved over the semiconductor surface 2, the smaller the pyramid sizes that can be observed on the semiconductor surface 2. The linear structure 7—illustrated in a magnified view in FIG. 5E—at the left edge of the irradiated section 4 arises from the semiconductor surface 2 being removed to a particularly small extent at the location of the semiconductor surface 2 at which the electron beam 3 was momentarily stationary.

Figure 6:
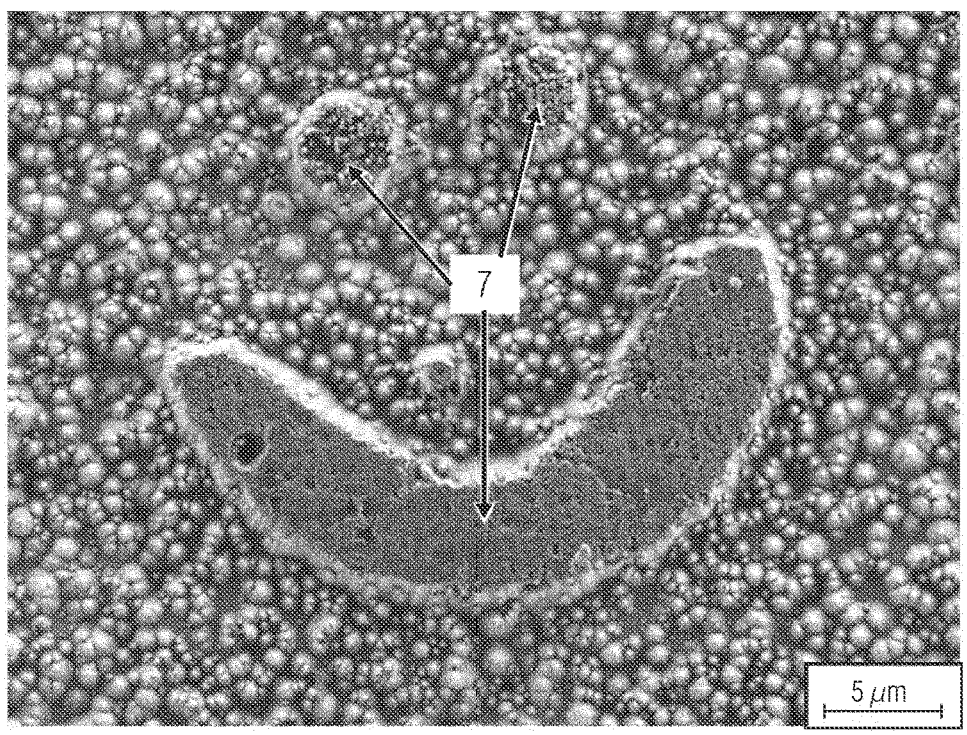

FIG. 6 shows an SEM micrograph of structures 7 on a semiconductor surface 2 of a GaN semiconductor body in accordance with one embodiment. The irradiation of the irradiated sections 4 of the semiconductor surface 2 was carried out with an energy of the electron beam 3 of 8 keV and an irradiation duration of 100 ms per pixel. The subsequent etching process comprises etching the semiconductor surface 2 for 6 minutes in 30% by weight KOH at 80° C. The structures 7 have the shape of circles (top) or a sector of an annulus (bottom).

Figure 7:
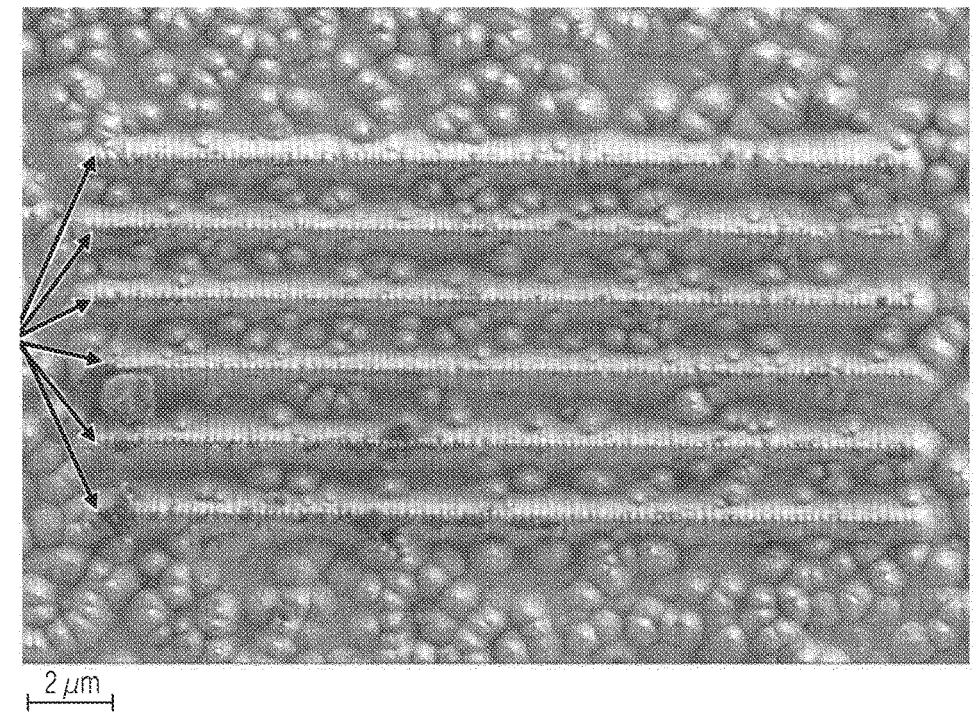
FIGS. 7, 8A-8F and 9A-9G show SEM micrographs of linear and parallel structures on a semiconductor surface of a semiconductor body in accordance with various embodiments.

FIG. 7 shows an SEM micrograph of linear and parallel structures 8 on a semiconductor surface 2 of a GaN semiconductor body in accordance with one embodiment. The irradiation of the linear and parallel sections 4 of the semiconductor surface 2 was carried out with an irradiation duration of 100 ms per pixel. Per linear section, 100 pixels were irradiated over a length of 15 μm. The subsequent etching process comprises etching the semiconductor surface 2 for 6 minutes in 30% by weight KOH at 80° C. The linear and parallel structures 8 have a common horizontal main direction of extent. The distances between the linear and parallel structures 8 perpendicular to the main direction of extent are 1.5 μm, as a result of which they touch one another at an etching depth of approximately 3 μm on account of the angles of the sidewalls of the resulting pyramids of 61° on the semiconductor surface 2. A reduced random roughening of the semiconductor surface 2 in and between the irradiated sections 4 can be discerned. Smaller etching depths and smaller distances between the pyramids may be expedient in the case of a thinner semiconductor layer.

FIGS. 8A to 8F show SEM micrographs of linear and parallel structures 8 on a semiconductor surface 2 of a GaN semiconductor body in accordance with one embodiment. The irradiation of the linear and parallel sections 4 was carried out with 100 ms per pixel and with different electron energies. An electron energy of 5 keV was used in FIG. 8A, 8 keV in FIG. 8B, 10 keV in FIG. 8C and 12 keV in FIG. 8D. The subsequent etching process comprised etching the semiconductor surface 2 for 6 minutes in 30% by weight KOH at 80° C. The SEM micrographs show that the electron energy does not influence the formation of the linear and parallel structures 8.

Figure 8A:
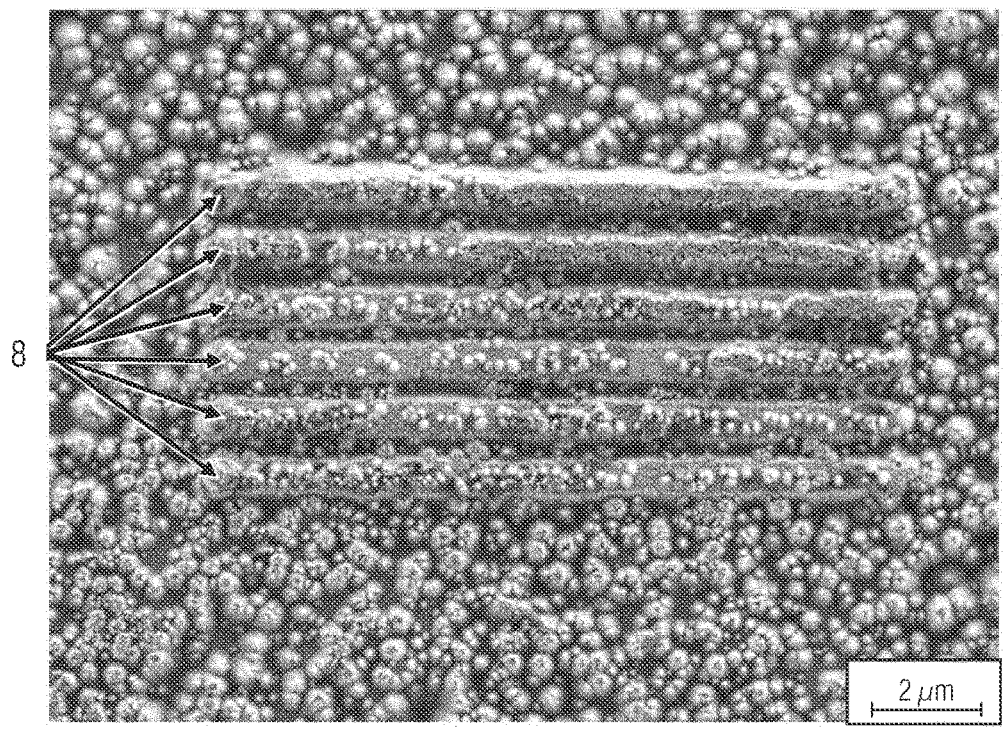
Figure 8B:
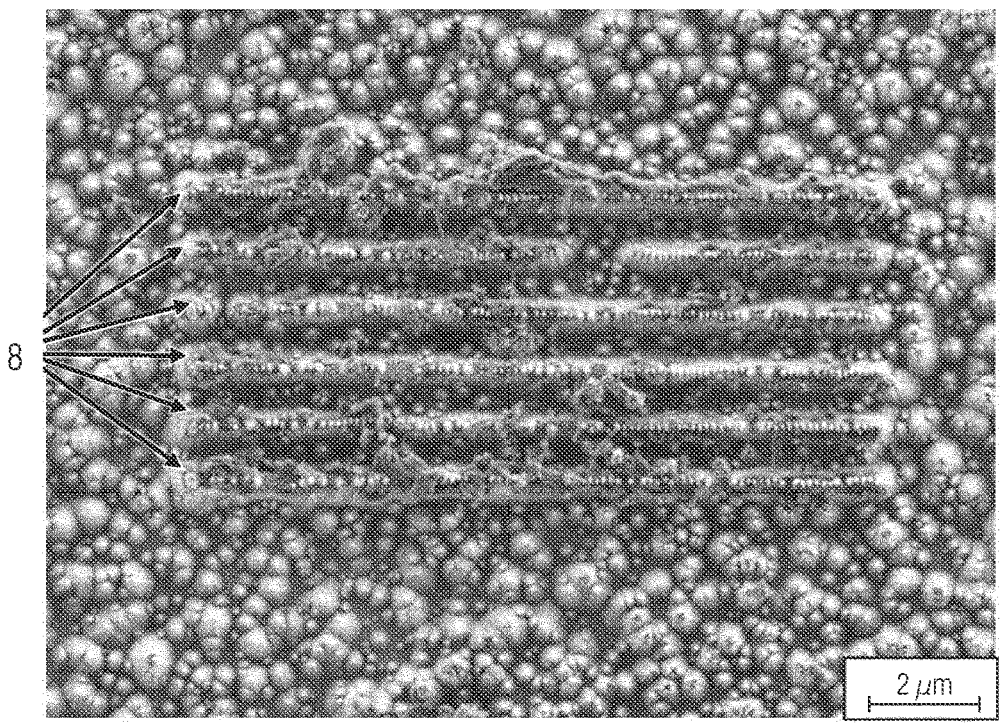
Figure 8C:
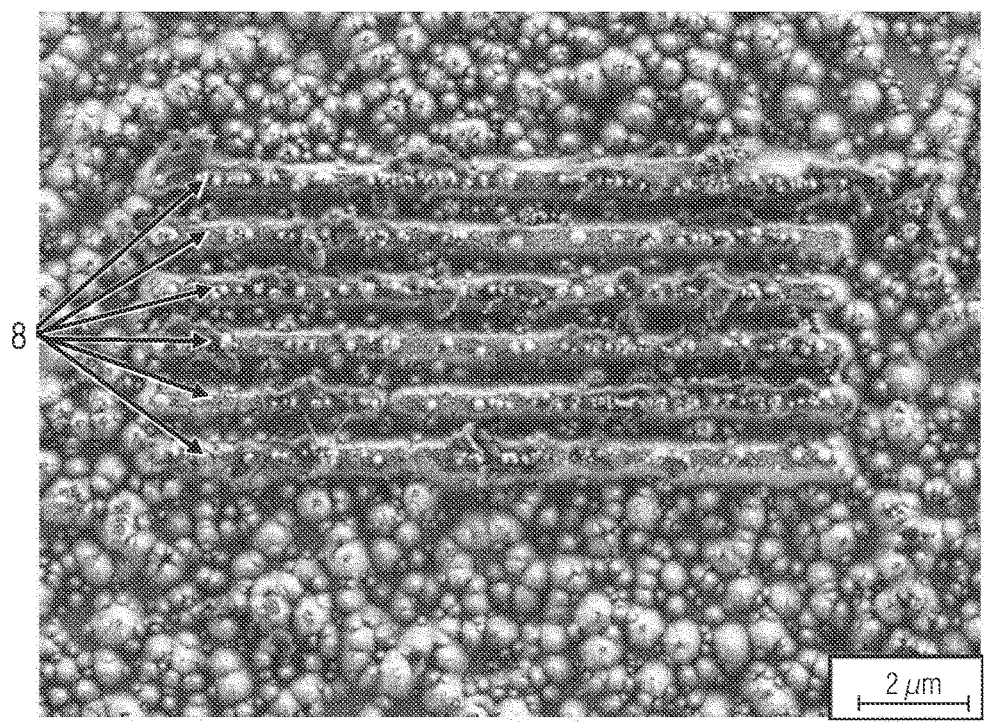
Figure 8D:
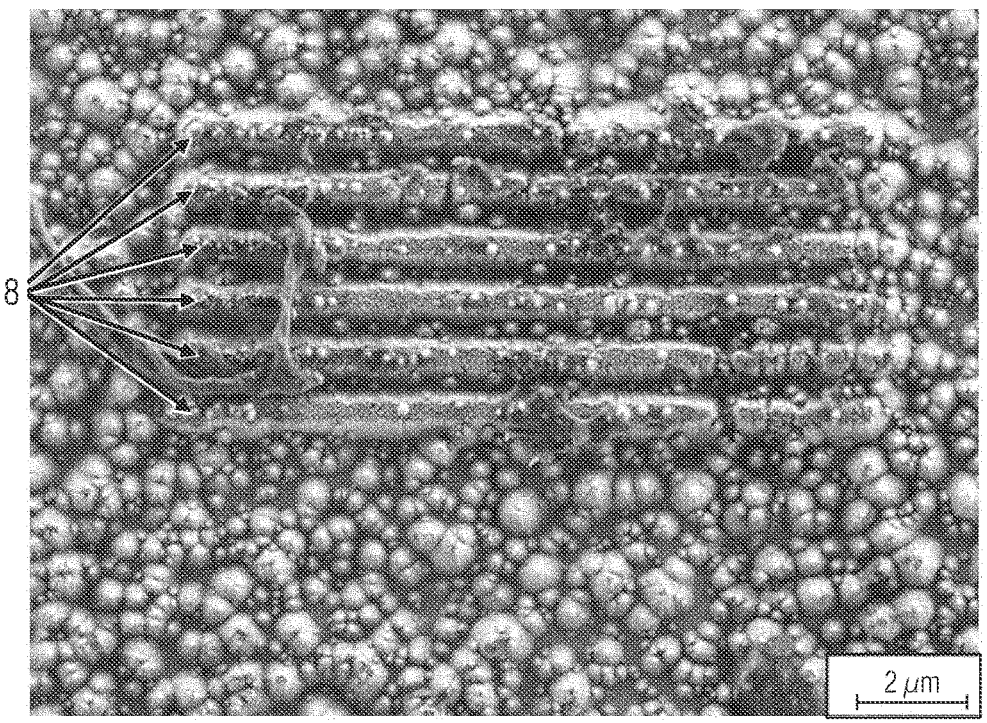
Figure 8E:
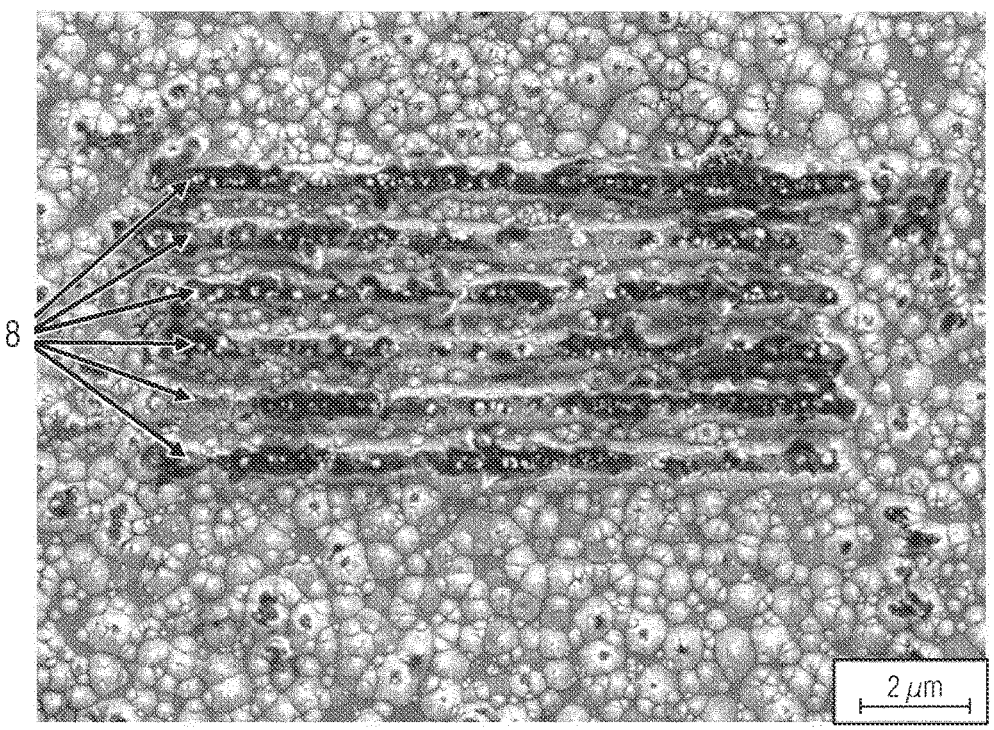
Figure 8F:
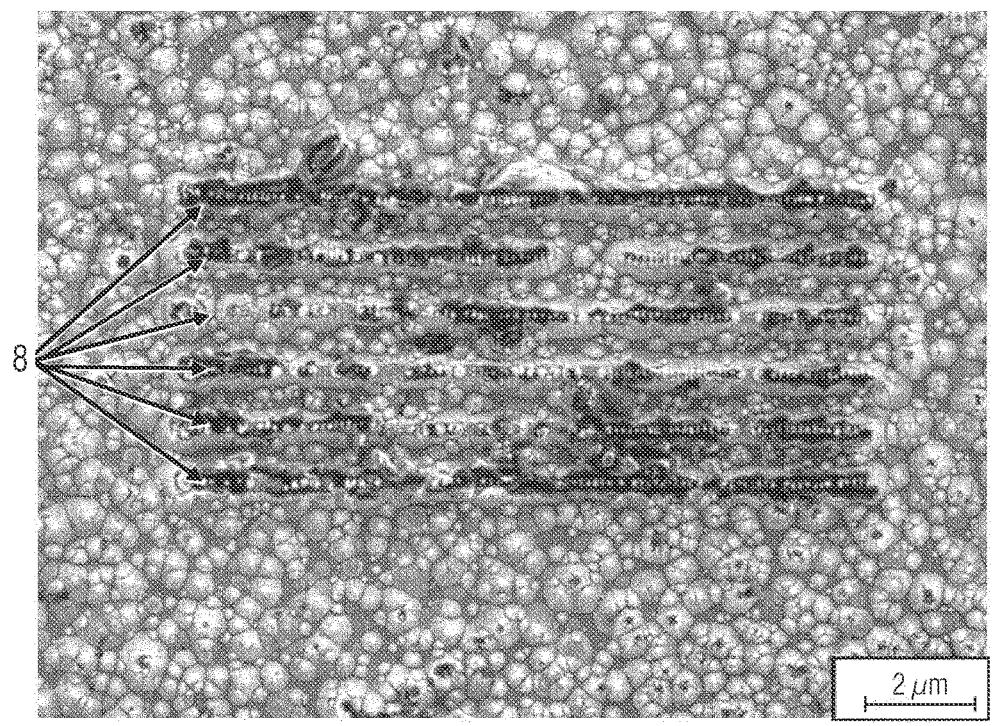

FIGS. 8E and 8F show SEM micrographs of the samples from FIGS. 8C and 8B, which were recorded by way of in-lens detection. The dark contrasts with this type of detection indicate a material having low conductivity that has been deposited on the GaN of the linear and parallel structures 8 and the semiconductor surface 2. During the structuring of the semiconductor surface, deposition of organic material on the surface may possibly occur. The origin of these deposits is not known. By way of example, this material may be carbon.

Figure 8G:
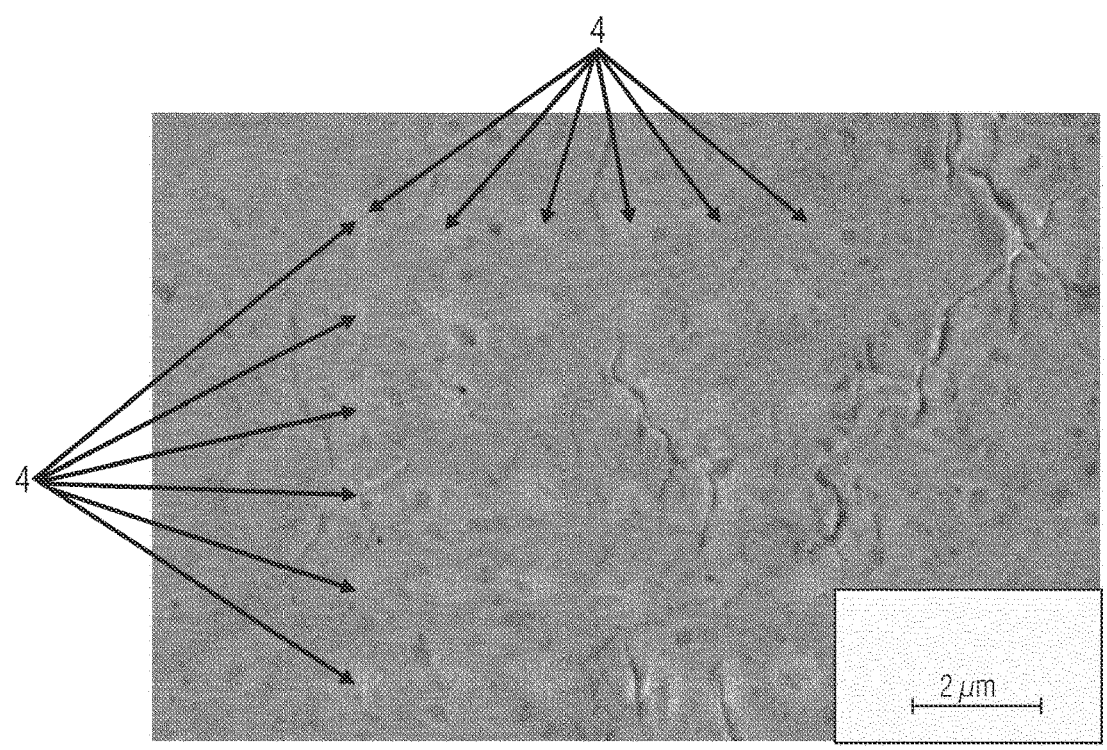
FIG. 8G shows an SEM micrograph of a semiconductor surface of a semiconductor body in accordance with one embodiment.
Figure 9A:
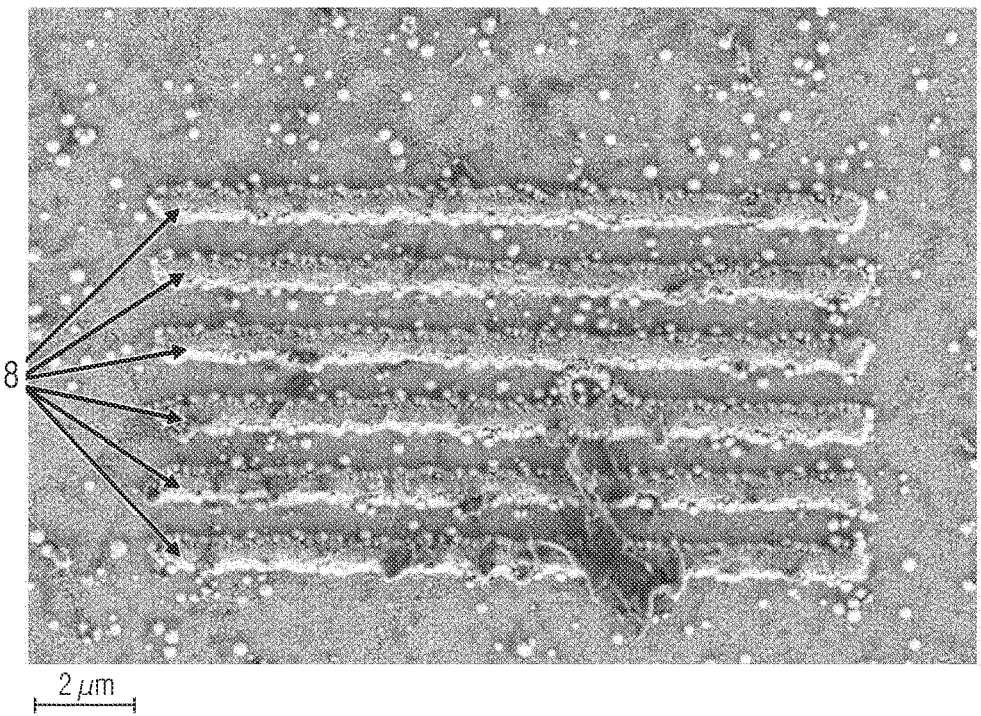
Figure 9B:
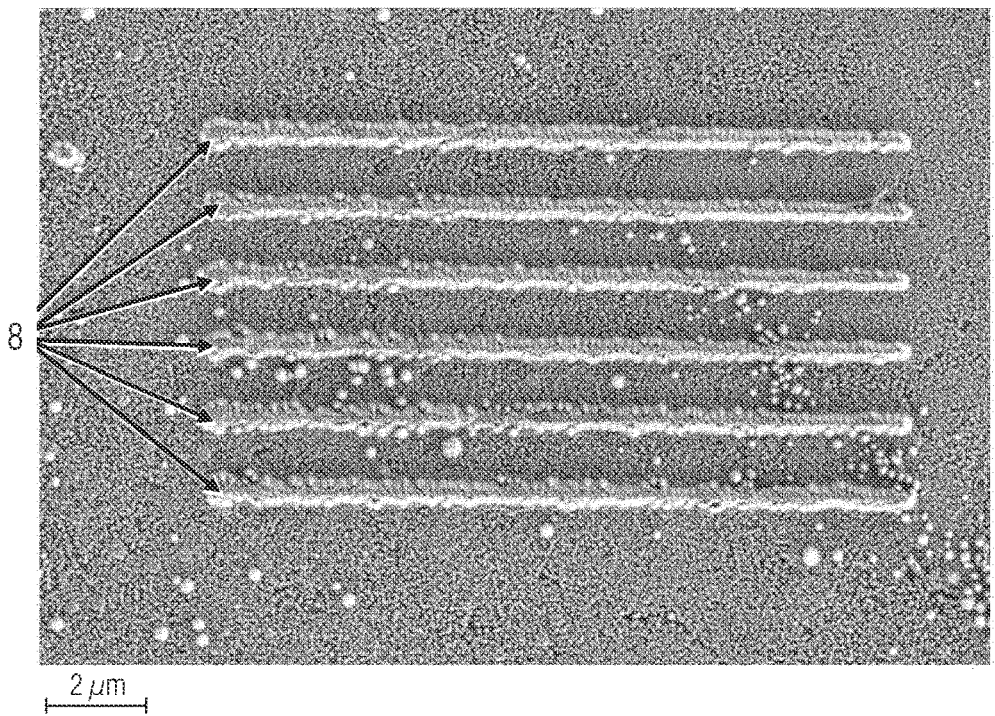
Figure 9C:
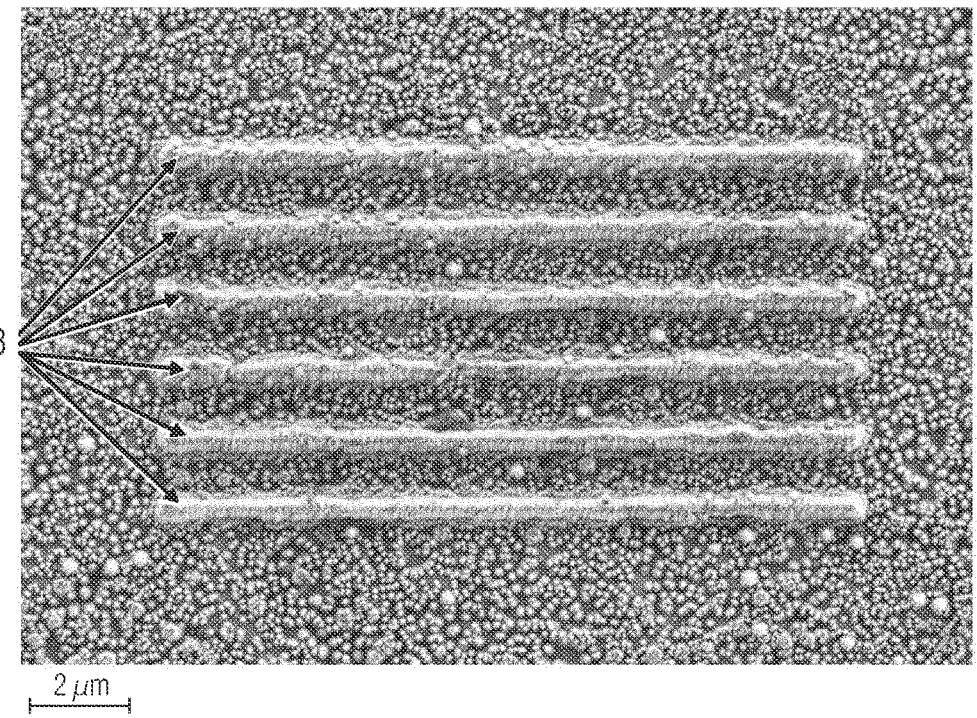
Figure 9D:
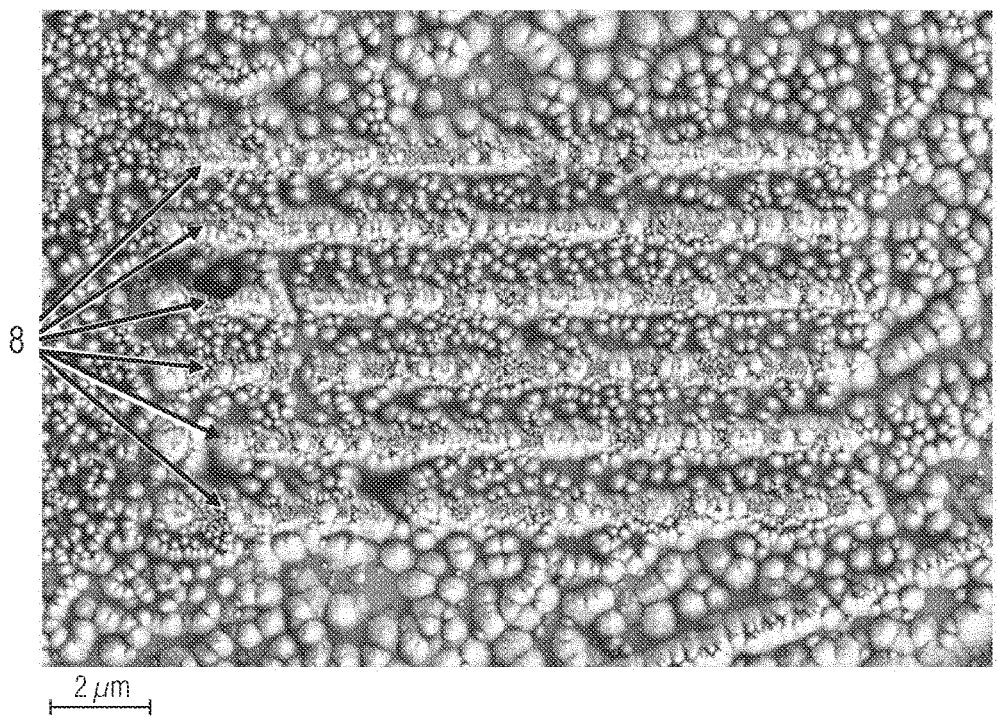
Figure 9E:
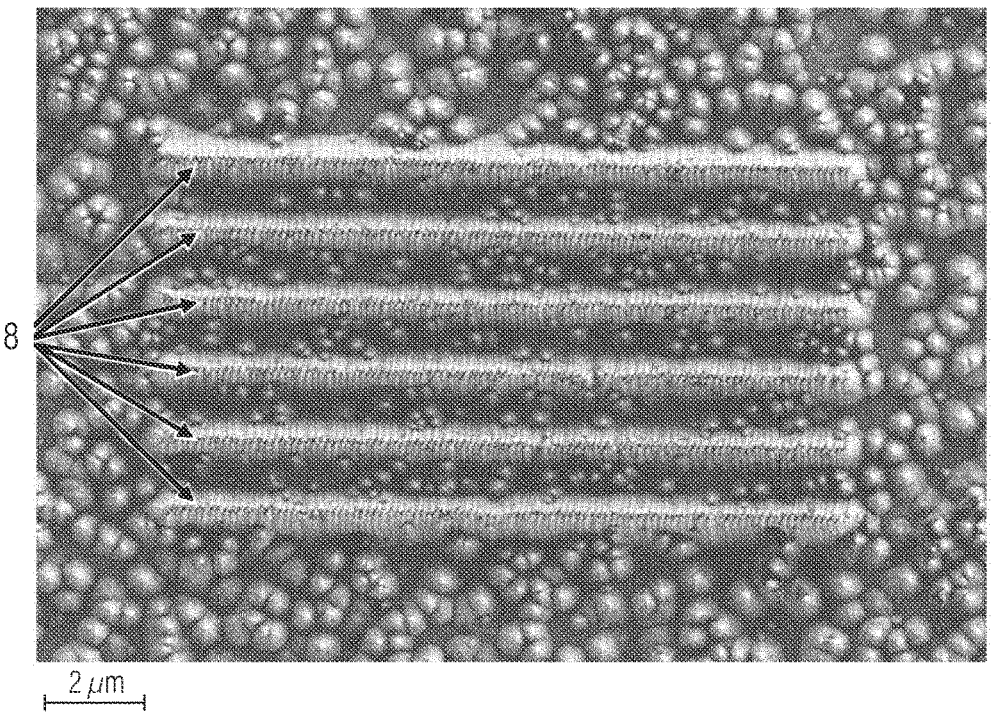
Figure 9F:
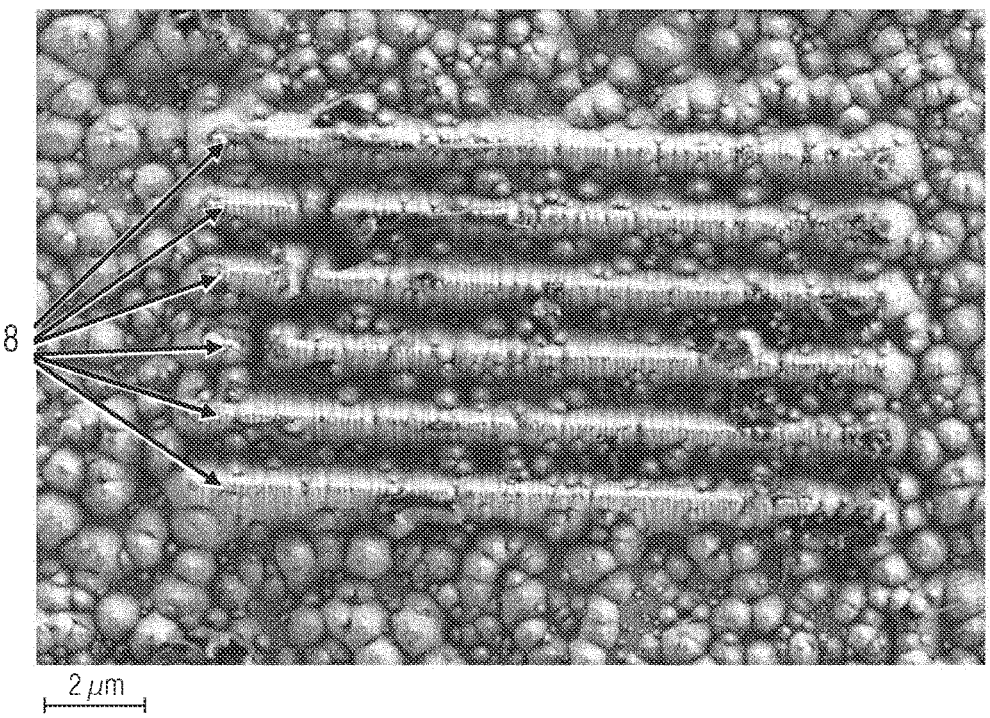
Figure 9G:
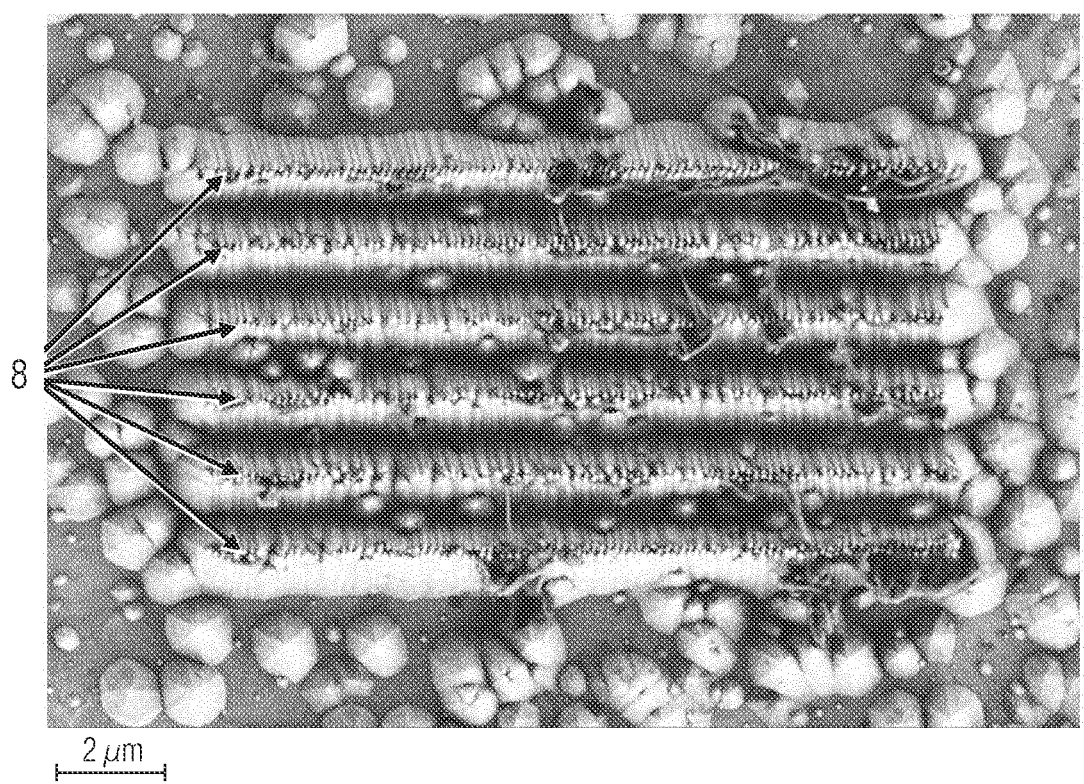

FIG. 8G shows an SEM micrograph of a semiconductor surface 2 of a GaN semiconductor body directly after irradiation of a point pattern. The irradiated sections 4 were irradiated with an electron energy of 8 keV and an irradiation duration of 5 seconds per pixel. White contrasts are evident in the irradiated sections 4. This may be an indication of an electronic effect that changes the conductivity or charge of the material. By way of example, the irradiation with the electron beam may result in an activation of passivated point defects of the semiconductor layer. In particular, FIG. 8G shows that there are no deposits on the semiconductor surface 2 before etching. The deposits that were observed after etching as shown in FIGS. 8E and 8F must therefore have arisen during or after the etching process.

FIGS. 9A to 9G show SEM micrographs of linear and parallel structures 8 on a semiconductor surface 2 of a GaN semiconductor body in accordance with one embodiment. The irradiation of the linear and parallel sections 4 was carried out with an electron energy of 8 keV and an irradiation duration of 100 ms per pixel. The subsequent etching process was carried out with 30% by weight KOH at 80° C. and the etching duration was varied. The semiconductor surface 2 was etched for 1 min in FIG. 9A, for 2 min in FIG. 9B, for 3 min in FIG. 9C, for 4 min in FIG. 9D, for 5 min in FIG. 9E, for 6 min in FIG. 9F and for 7 min in FIG. 9G. In all the figures, the linear and parallel structures 8 are clearly discernible and correspond approximately to the preferred target roughness in the productive application. An increase in the etching duration results in an intensified random roughening of the semiconductor surface 2 in the unirradiated sections 5.

Figure 10:
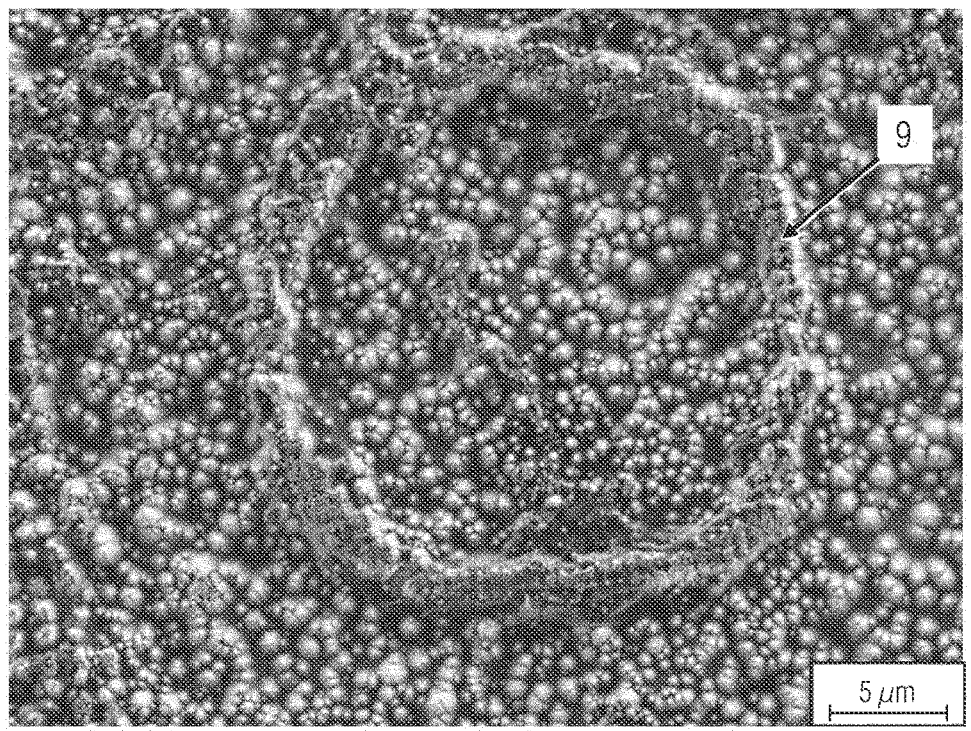
FIG. 10 shows an SEM micrograph of a ring-shaped structure on a semiconductor surface of a semiconductor body in accordance with one embodiment.

FIG. 10 shows an SEM micrograph of a ring-shaped structure 9 on a semiconductor surface 2 of a GaN semiconductor body in accordance with one embodiment. The ring-shaped section 4 was irradiated with an electron energy of 8 keV and an irradiation duration of 100 ms per pixel. The subsequent etching process comprised etching the semiconductor surface 2 for 6 min with 30% by weight KOH at 80° C. The ring-shaped structure 9 approximately has the shape of an annulus.

When producing concentric ring-shaped structures 9, the entire circle pattern can have a radius of 500 μm with a chip diameter of 1 mm. In particular, the ring-shaped structures 9 on the semiconductor surface 2 should touch one another. Given an etching depth of approximately 3.5 μm, a distance of 2 μm may then be expedient. Otherwise sections with a random roughening are situated between the ring-shaped structures 9.

Figure 11A:
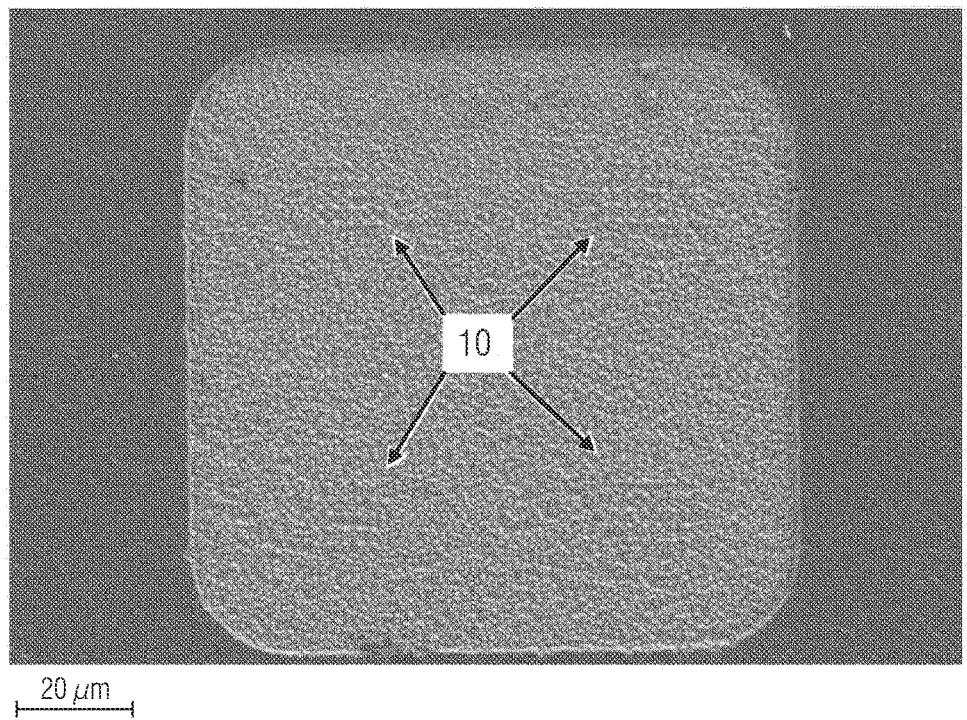
FIGS. 11A-11H, 12, 13 and 14A-C show SEM micrographs of pyramidal structures on a semiconductor surface of a semiconductor body in accordance with various embodiments.
Figure 11B:
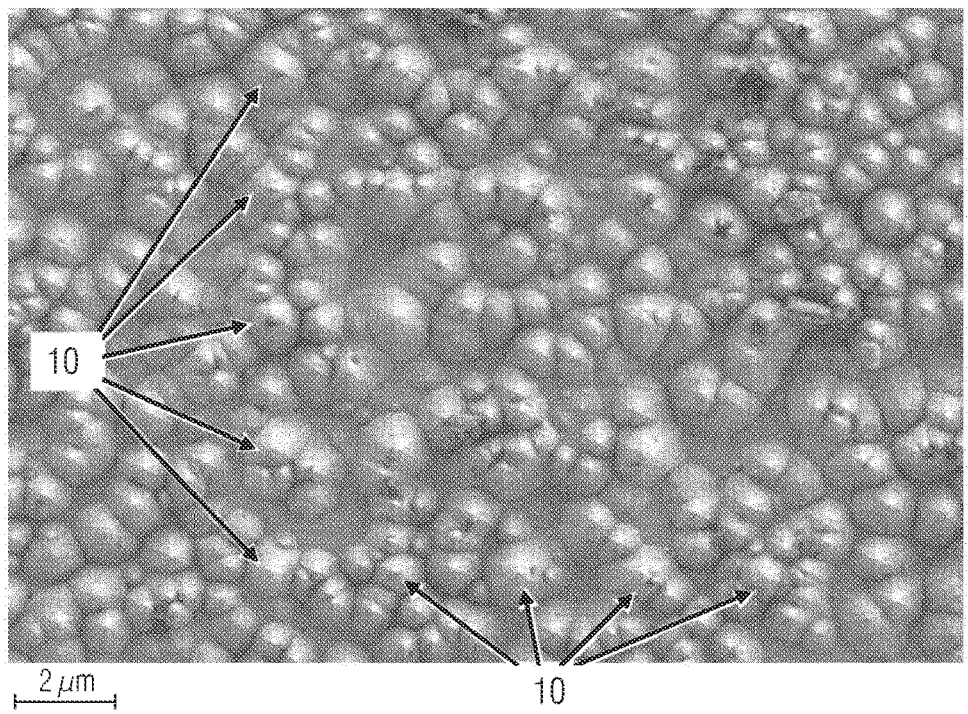
Figure 11C:
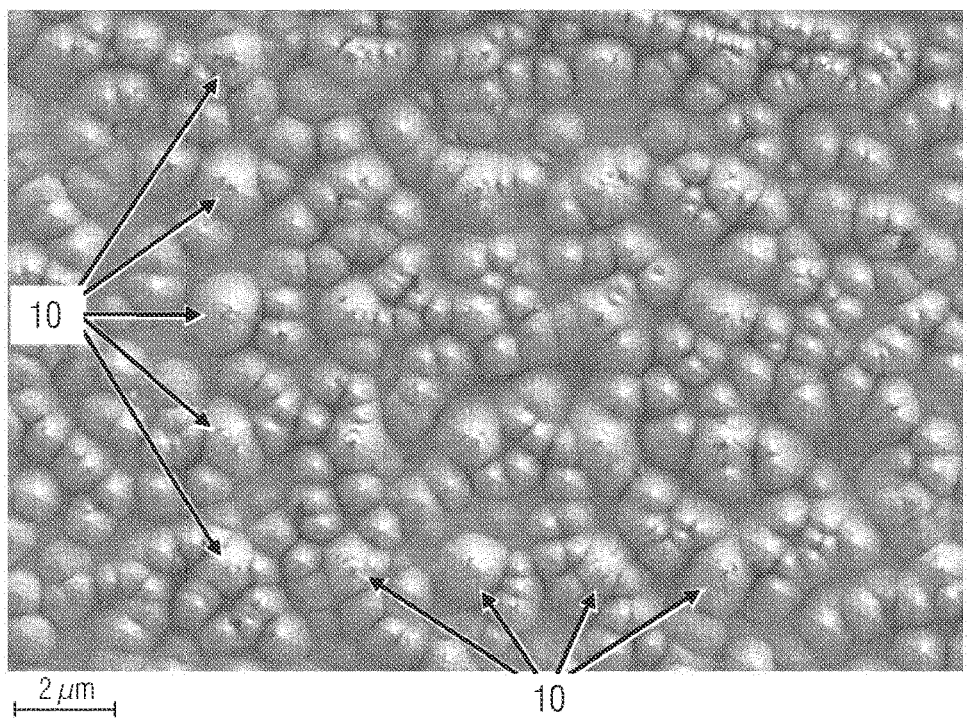
Figure 11D:
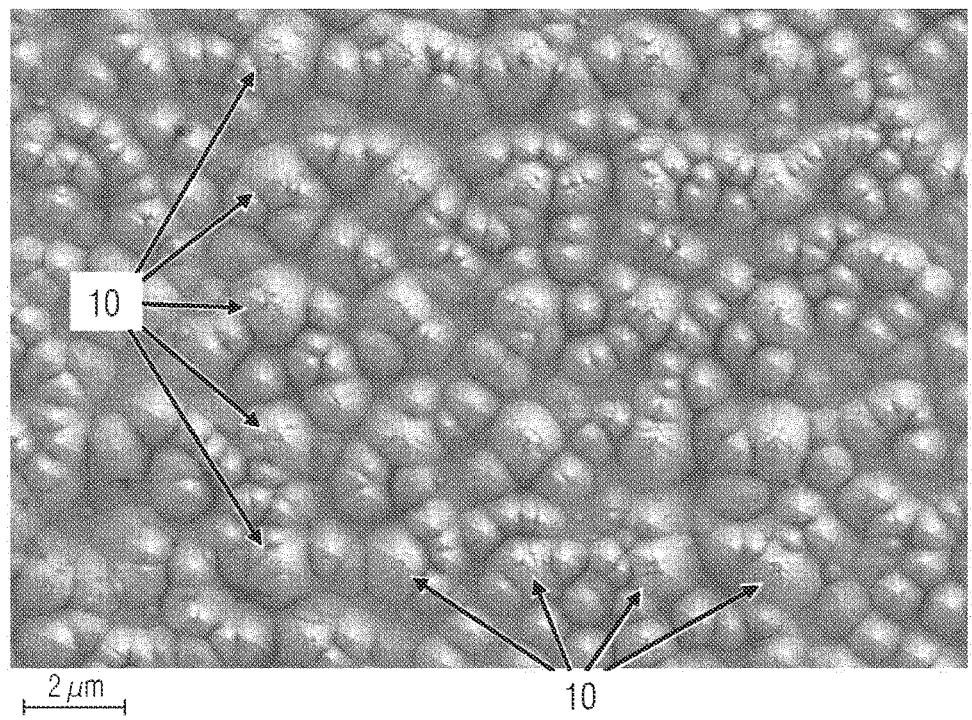
Figure 11E:
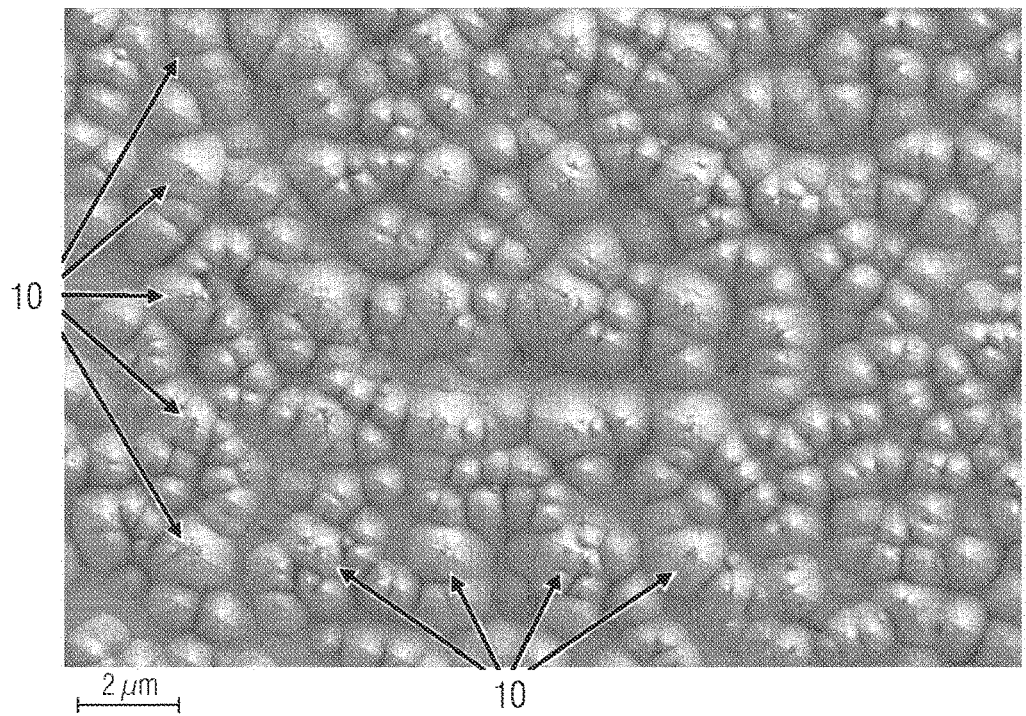
Figure 11F:
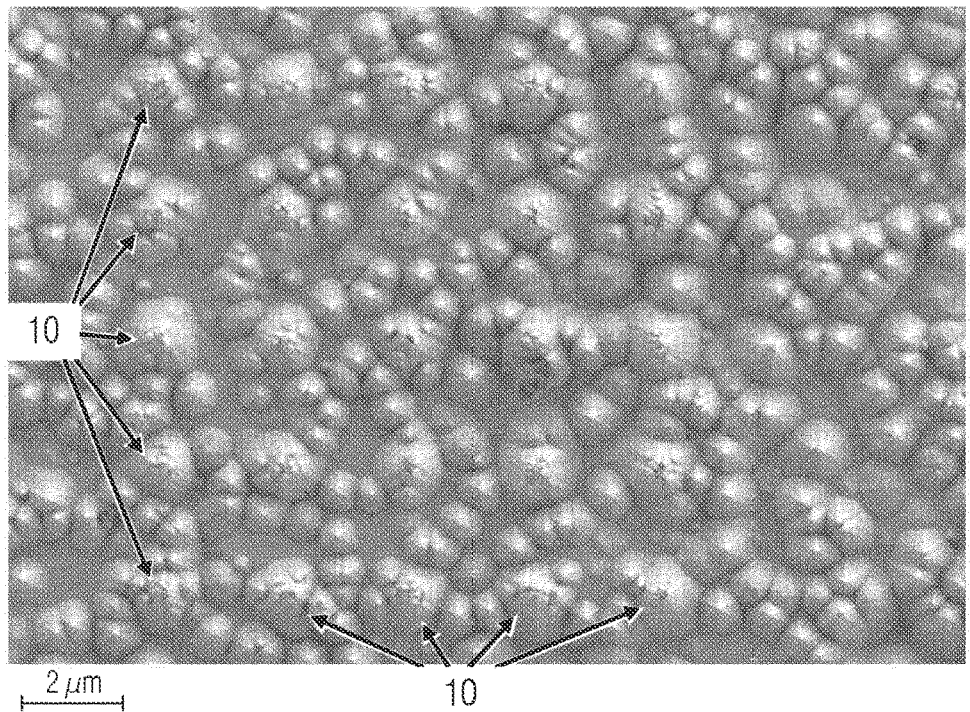

FIGS. 11A to 11H show SEM micrographs of pyramidal structures 10 on a semiconductor surface 2 of a GaN semiconductor body in accordance with one embodiment. The punctiform irradiation of circular sections 4 with the extent of the electron beam 3 on the semiconductor surface 2 was carried out along a regular grid comprising 5×5 sections with an electron energy of 8 keV and the irradiation duration per pixel was varied. The subsequent etching process comprised etching the semiconductor surface 2 for 6 min with 30% by weight KOH at 80° C. FIG. 11A shows an overview micrograph of the pyramidal structures 10 with an irradiation duration of 2 s (bottom right), 3 s (bottom left), 4 s (top right) and 5 s (top left). The pyramidal structures 10 are arranged along regular 5×5 grids. FIGS. 11B to 11H show magnified views of the irradiated grids (left and bottom boundaries marked in each case) with various irradiation durations. The irradiation duration was 0.1 s in FIG. 11B, 1 s in FIG. 11C, 2 s in FIG. 11D, 3 s in FIG. 11E, 4 s in FIG. 11F, 5 s in FIG. 11G and 10 s in FIG. 11H. The pyramidal structures 10 are evident starting from an irradiation duration of 0.1 s, the manifestation of said pyramidal structures increasing as the irradiation duration increases.

Figure 11G:
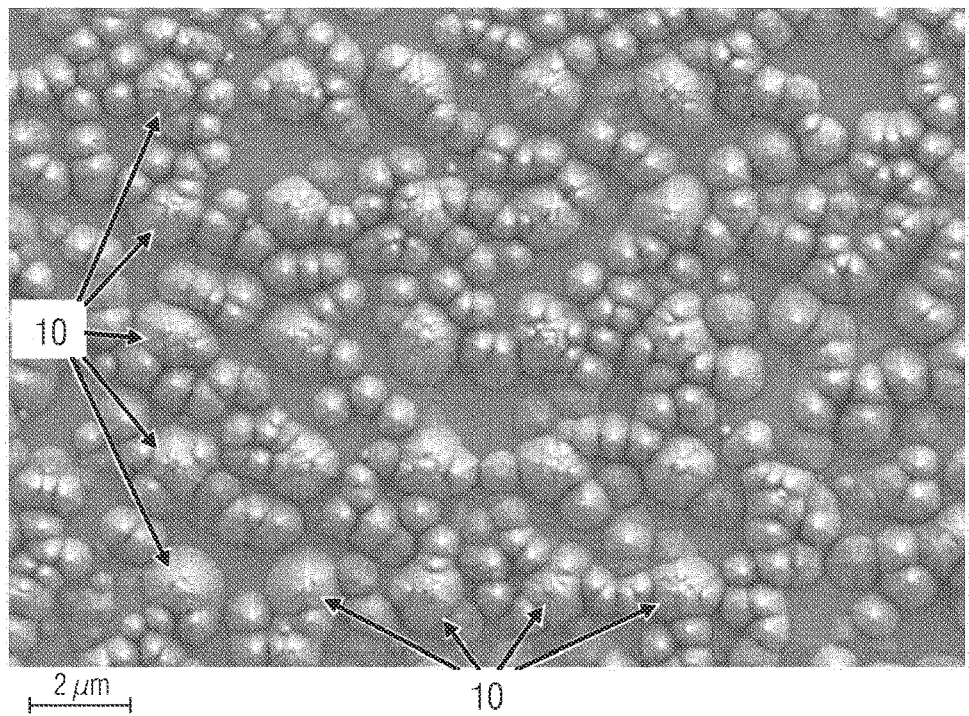
Figure 11H:
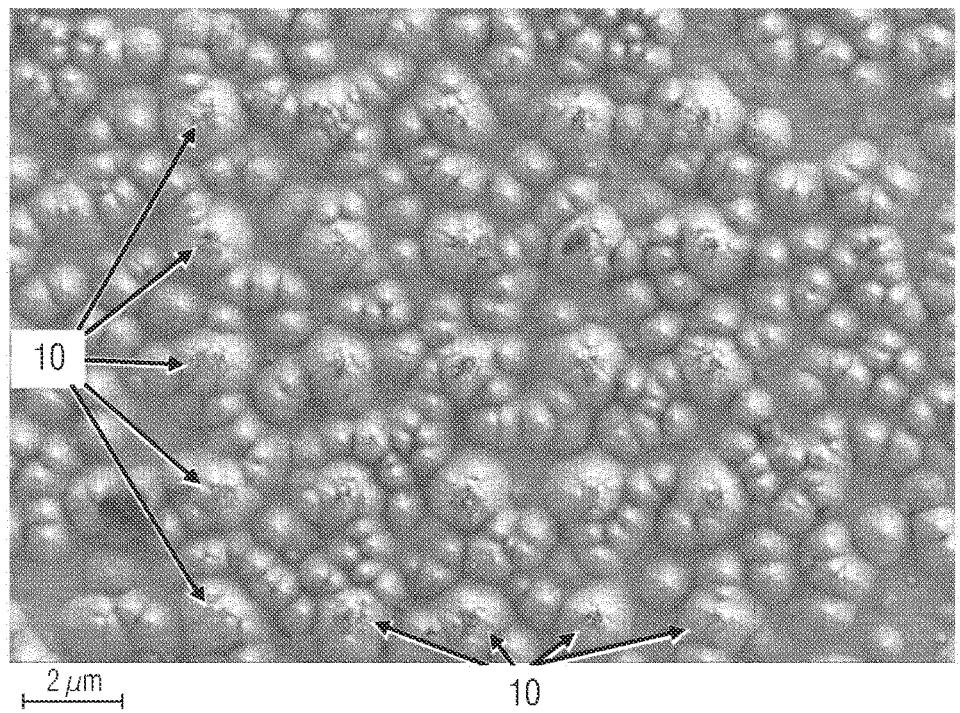
Figure 12:
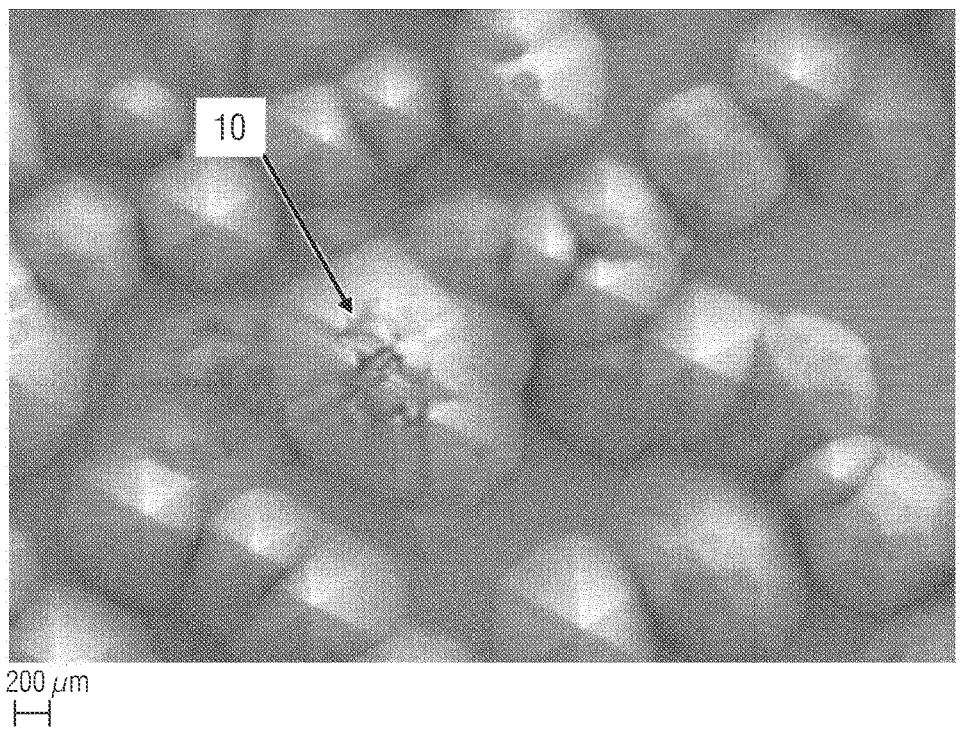

FIG. 12 shows an SEM micrograph of a magnified view of a pyramidal structure 10 from FIG. 11G. The pyramidal structure 10 has a split and finely roughened vertex. In particular, the vertex of the pyramidal structure 10 has a diameter approximately 400 nm wide. It is thus possible to observe a larger top area of the pyramidal structure 10 than the area of the irradiated circular section having a diameter of 20 nm.

Figure 13:
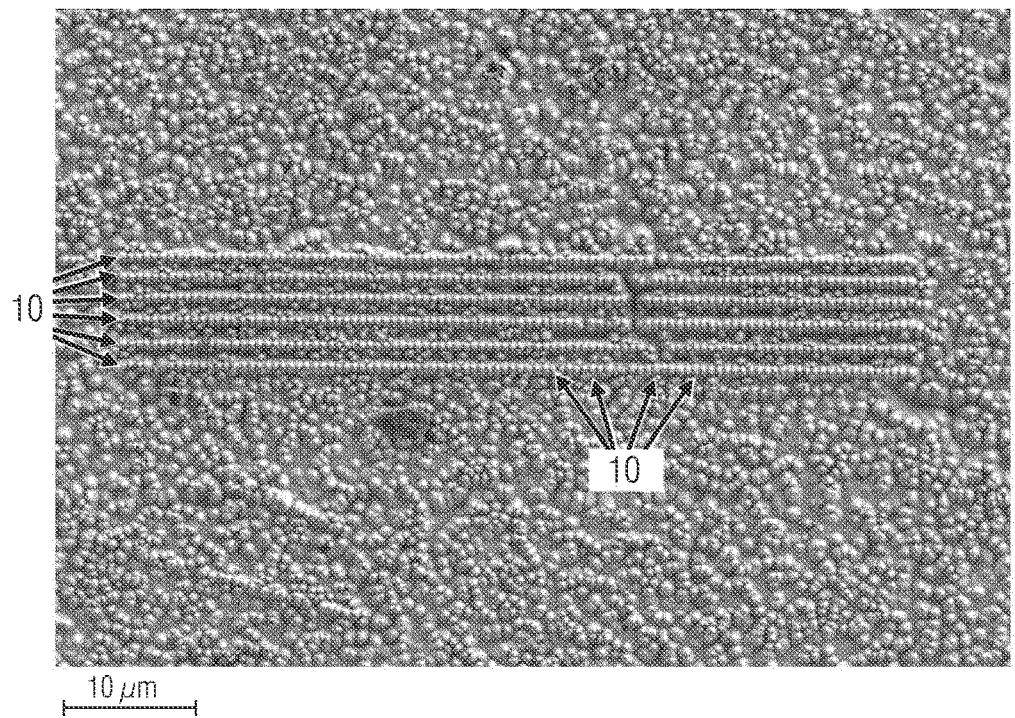

FIG. 13 shows an SEM micrograph of pyramidal structures 10 on a semiconductor surface 2 of a GaN semiconductor body in accordance with one embodiment. The punctiform irradiation of circular sections 4 was carried out with an electron energy of 8 keV and an irradiation duration of 100 ms per pixel. The distance between the lines is 1.5 μm. The length of the lines is 45 μm with 100 pixels over the entire length. The subsequent etching process comprised etching the semiconductor surface 2 for 6 min with 30% by weight KOH at 80° C. In the horizontal direction of extent the individual pyramidal structures caused touch one another on the semiconductor surface 2, whereas they are at a distance from one another in the vertical direction of extent.

Figure 14A:
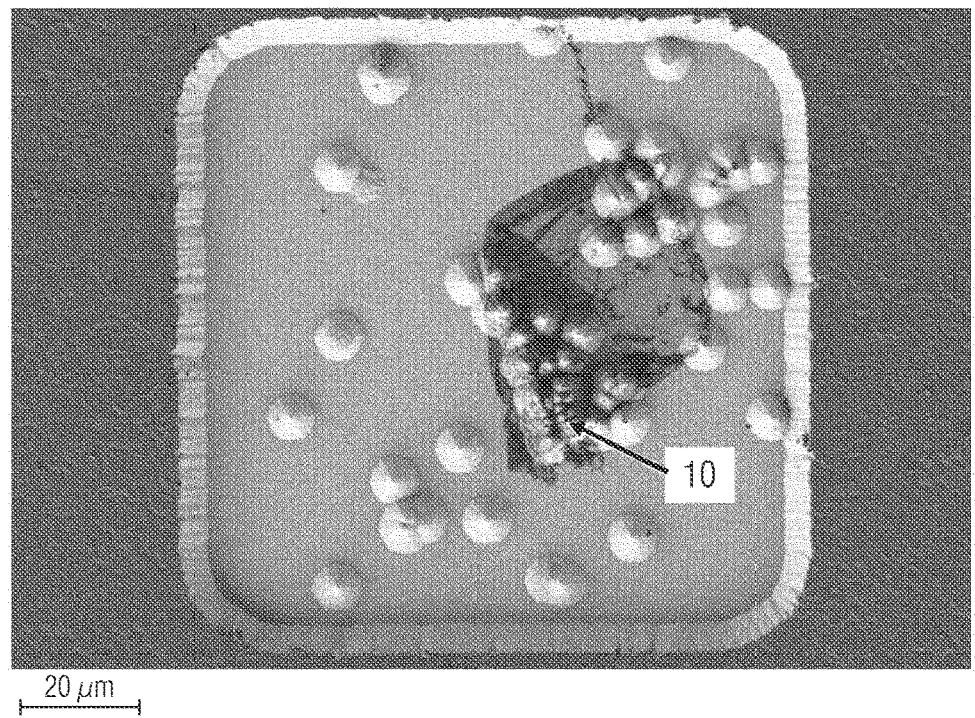
Figure 14B:
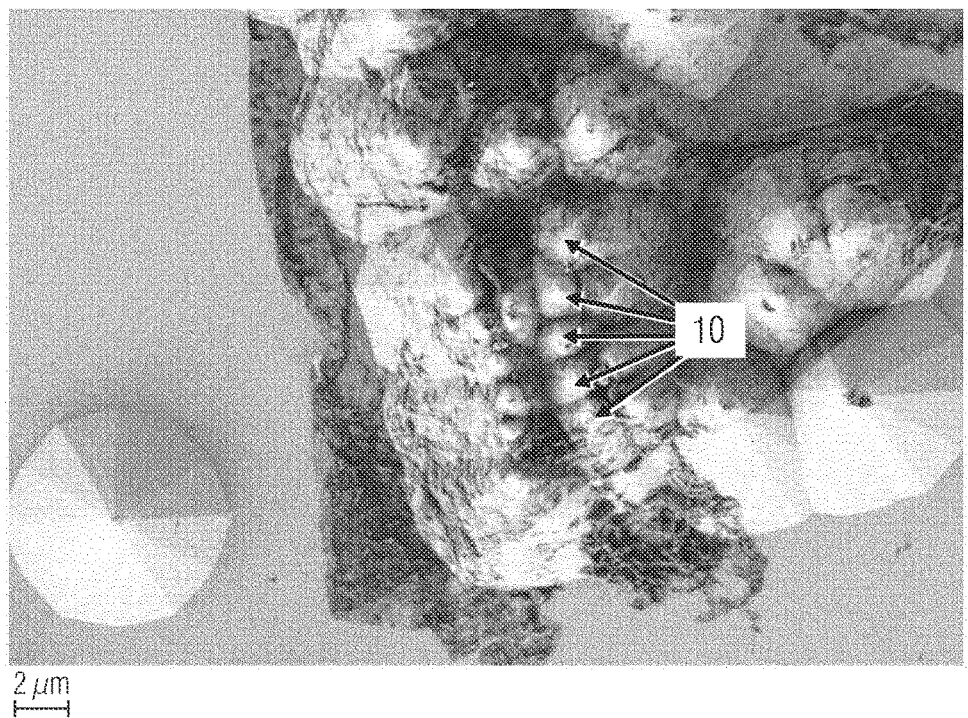
Figure 14C:
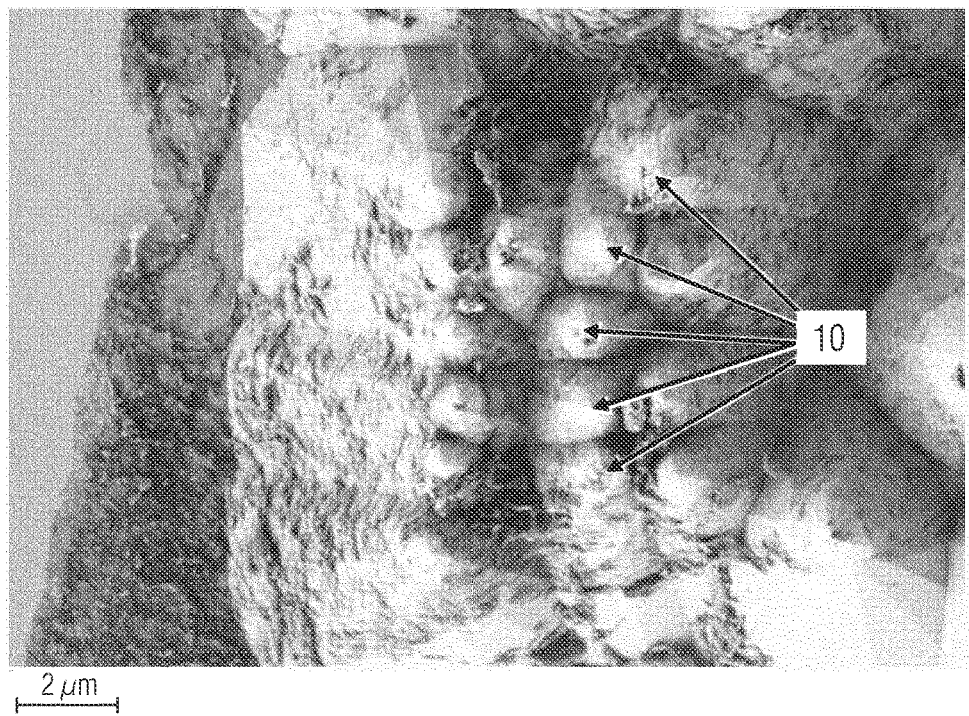

FIGS. 14A-C show SEM micrographs of pyramidal structures 10 on a semiconductor surface of a GaN semiconductor body in accordance with one embodiment. The punctiform irradiation of 6×6 circular sections 4 with distances of 1.5 µm was carried out with an irradiation duration of 10 s per pixel and an electron energy of 8 keV. The subsequent etching process comprised etching the semiconductor surface 2 for 5 min with 85% by weight $H_3PO_4$ at 150° C. FIG. 14A shows that almost the entire semiconductor was etched away. The magnified views in FIGS. 14B and 14C show that pyramidal structures 10 are present at the irradiated locations.

This method can find potential application in the separation of individual semiconductor chips. By means of targeted exposure it is possible to produce surface structures, such as alignment marks, which are attacked during the etching process to a lesser extent than the semiconductor material of the unirradiated sections.

The invention is not restricted to the exemplary embodiments by the description on the basis thereof. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for structuring a semiconductor surface, the method comprising:
   providing the semiconductor surface, wherein the semiconductor surface is part of a GaN-semiconductor layer;
   irradiating the semiconductor surface by moving an electron beam over the semiconductor surface in order to produce an irradiated section; and
   anisotropic wet-chemical etching of the semiconductor surface,
   wherein an etching rate in the irradiated section is less than that in an unirradiated section of the semiconductor surface, and
   wherein no etching mask is applied to the semiconductor surface before anisotropic wet-chemical etching.

2. The method of claim 1, wherein the semiconductor layer comprises a III/V semiconductor.

3. The method of claim 2, wherein the semiconductor layer comprises a nitride semiconductor.

4. The method of claim 1, wherein energy of the electron beam is between 1 keV and 200 keV inclusive.

5. The method of claim 1, wherein an irradiation duration of irradiating the semiconductor surface with the electron beam is greater than or equal to 10 ms.

6. The method of claim 1, wherein wet-chemical etching of the semiconductor surface comprises wet-chemical etching with an alkaline solution.

7. The method of claim 1, wherein wet-chemical etching of the semiconductor surface comprises wet-chemical etching with KOH, NaOH, $NH_3$ or TMAH.

8. The method of claim 1, wherein wet-chemical etching of the semiconductor surface comprises wet-chemical etching with an acid.

9. The method of claim 1, wherein a plurality of parallel sections of the semiconductor surface are irradiated with the electron beam, and wherein the parallel sections have a common main direction of extent.

10. The method of claim 1, wherein at least one ring-shaped section of the semiconductor surface is irradiated with the electron beam.

11. The method of claim 10, wherein at least two ring-shaped sections of the semiconductor surface are irradiated with the electron beam, and wherein radii of the irradiated ring-shaped sections differ from one another.

12. The method of claim 11, wherein at least two concentric ring-shaped sections of the semiconductor surface are irradiated with the electron beam.

13. The method of claim 1, wherein a punctiform irradiation of the semiconductor surface is carried out with the electron beam.

14. The method of claim 1, wherein moving the electron beam over the semiconductor surface comprises moving the electron beam over the semiconductor surface in order to produce irradiated sections.

15. The method of claim 14, wherein the electron beam is accelerated and deaccelerated.

16. A method for structuring a semiconductor surface, the method comprising:
   providing the semiconductor surface, wherein the semiconductor surface is part of a GaN-semiconductor layer;
   irradiating the semiconductor surface with an electron beam in order to produce an irradiated section; and
   anisotropic wet-chemical etching of the semiconductor surface,
   wherein an etching rate in the irradiated section is less than that in an unirradiated section of the semiconductor surface,
   wherein no etching mask is applied to the semiconductor surface before anisotropic wet-chemical etching, and
   wherein at least one ring-shaped section of the semiconductor surface is irradiated with the electron beam.

17. The method of claim 16, wherein at least two ring-shaped sections of the semiconductor surface are irradiated with the electron beam, and wherein radii of the irradiated ring-shaped sections differ from one another.

18. The method of claim 16, wherein at least two concentric ring-shaped sections of the semiconductor surface are irradiated with the electron beam.

19. The method of claim 16, wherein the electron beam is guided over the semiconductor surface along curves.

* * * * *

UNITED STATES PATENT AND TRADEMARK OFFICE
CERTIFICATE OF CORRECTION

PATENT NO. : 12,094,928 B2
APPLICATION NO. : 17/439695
DATED : September 17, 2024
INVENTOR(S) : Tautz et al.

It is certified that error appears in the above-identified patent and that said Letters Patent is hereby corrected as shown below:

In the Claims

In Column 17, in Claim 1, Line 30, delete "in order to" and insert -- to thereby --.

Signed and Sealed this
Twenty-ninth Day of October, 2024

Katherine Kelly Vidal
*Director of the United States Patent and Trademark Office*